(12) United States Patent
Akkary et al.

(10) Patent No.: US 10,691,597 B1
(45) Date of Patent: Jun. 23, 2020

(54) METHOD AND SYSTEM FOR PROCESSING BIG DATA

(71) Applicant: MIFrontiers Corporation, Portland, OR (US)

(72) Inventors: Haitham Akkary, Portland, OR (US); Abdulrahman Kaitoua, Berlin (DE); Raghid Morcel, Mount Lebanon (LB)

(73) Assignee: MIFrontiers Corporation, Portland, OR (US)

( * ) Notice: Subject to any disclaimer, the term of this patent is extended or adjusted under 35 U.S.C. 154(b) by 0 days.

(21) Appl. No.: 16/814,983

(22) Filed: Mar. 10, 2020

Related U.S. Application Data

(60) Provisional application No. 62/885,251, filed on Aug. 10, 2019.

(51) Int. Cl.
    *G06F 12/0811* (2016.01)
    *G06F 12/06* (2006.01)
    *G06F 12/0804* (2016.01)

(52) U.S. Cl.
    CPC ...... *G06F 12/0811* (2013.01); *G06F 12/0646* (2013.01); *G06F 12/0804* (2013.01); *G06F 2212/1032* (2013.01); *G06F 2212/152* (2013.01); *G06F 2212/154* (2013.01); *G06F 2212/608* (2013.01)

(58) Field of Classification Search
    None
    See application file for complete search history.

(56) References Cited

U.S. PATENT DOCUMENTS

| 7,617,381 B2 | 11/2009 | Kim et al. |
| 9,235,512 B2 | 1/2016 | Dietrich |
| 2008/0028186 A1 | 1/2008 | Casselman |

OTHER PUBLICATIONS

Meinel, Matt, "Why FPGA actually stands for 'financial program greatly accelerated'", Intel: Solution Brief, pp. 1-7, Apr. 25, 2019.
Vuletic, Miljan, "Virtual Memory Window for Application-Specific Reconfigurable Coprocessors", IEEE Transactions, vol. 14, Aug. 2006.

*Primary Examiner* — Charles Rones
*Assistant Examiner* — Jonah C Krieger
(74) *Attorney, Agent, or Firm* — Roark IP

(57) ABSTRACT

The system and method described features mechanisms from a big data analytics platform that provides the performance and energy benefits of integrated acceleration circuits such as field programmable gate arrays (FPGA), application specific integrated circuits (ASIC) or custom circuits without sacrificing the ease of developing applications on distributed cluster-computing frameworks like Apache Spark.

22 Claims, 12 Drawing Sheets

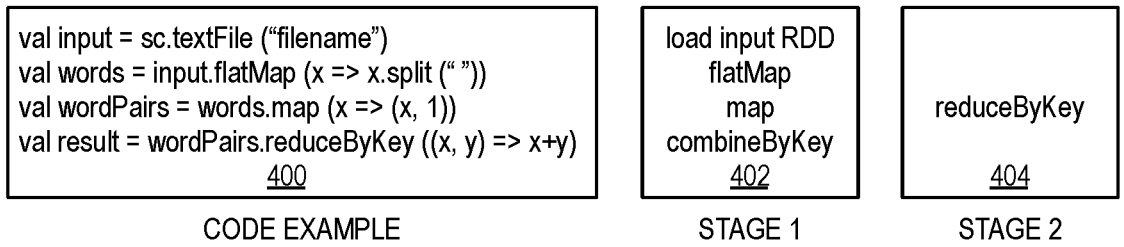

| | |
|---|---|
| val input = sc.textFile ("filename")<br>val words = input.flatMap (x => x.split (" "))<br>val wordPairs = words.map (x => (x, 1))<br>val result = wordPairs.reduceByKey ((x, y) => x+y)<br>400 | load input RDD<br>flatMap<br>map<br>combineByKey<br>402 | reduceByKey<br>404 |
| CODE EXAMPLE | STAGE 1 | STAGE 2 |

FIG. 4

| | |
|---|---|
| Text File | Spark includes multiple software packages the run on Spark Core execution engine. These are Spark SQL Spark Streaming Spark MLib and Spark GraphX engine |
| Worker Node 1 RDDs at end of stage 1 | input RDD: "Spark includes multiple software packages that run on Spark Core execution engine"<br>words RDD: "Spark" "includes" "multiple" "software" "packages" "that" "run" "on" "Spark" "Core" "execution" "engine"<br>wordPairs RDD: (Spark 1) (includes 1) (multiple 1) (software 1) (packages 1) (that 1) (run 1) (on 1) (Spark 1) (Core 1) (execution 1) (engine 1)<br>Combined wordPairs RDD: (Spark 2) (includes 1) (multiple 1) (software 1) (packages 1) (that 1) (run 1) (on 1) (Spark 1) (Core 1) (execution 1) (engine 1) |
| Worker Node 2 RDDs at end of stage 1 | input RDD: "These are Spark SQL Spark Streaming Spark MLib and Spark GraphX engine"<br>words RDD: "These" "are" "Spark" "SQL" "Spark" "Streaming" "Spark" "MLib" "and" "Spark" "GraphX" "engine"<br>wordPairs RDD: (These 1) (are 1) (Spark 1) (SQL 1) (Spark 1) (Streaming 1) (Spark 1) (MLib 1) (and 1) (Spark 1) (GraphX 1) (engine 1)<br>Combined wordPairs RDD: (These 1) (are 1) (Spark 4) (SQL 1) (Streaming 1) (MLib 1) (and 1) (GraphX 1) (engine 1) |
| Worker Node 1 files on local disk after shuffle write | File 1: (Spark 2) (Software 1) (packages 1) (that 1) (run 1)<br>File 2: (includes 1) (multiple 1) (on 1) (Core 1) (execution 1) (engine 1) |
| Worker Node 2 files on local disk after shuffle write | File 1: (These 1) (Spark 4) (SQL 1) (streaming 1)<br>File 2: (are 1) (MLib 1) (and 1) (GraphX 1) (engine 1) |
| Worker Node 1 RDDs at end of stage 2 | result RDD: (Spark 6) (Software 1) (packages 1) (that 1) (run 1) (these 1) (SQL 1) (streaming 1) |
| Worker Node 2 RDDs at end of stage 2 | result RDD: (includes 1) (multiple 1) (on 1) (Core 1) (execution 1) (engine 2) (are 1) (MLib 1) (and 1) (GraphX 1) |

FIG. 5

| COMMAND | DESCRIPTION | ARGUMENT 1 | ARGUMENT 2 |
|---|---|---|---|
| AllocateRDD | ALLOCATE SPACE FOR AN RDD IN FPGA VIRTUAL MEMORY BY INITIALIZING AN RDD ENTRY IN RDD TABLE AND COPYING THE RDD VIRTUAL BASE ADDRESS TO THE RDD COUNTER REGISTER | ID | SIZE |
| AllocateRDDPage | ALLOCATE SPACE FOR AN RDD IN FPGA DRAM AND CREATE VIRTUAL TO PHYSICAL MEMORY MAPPING | ID | VIRTUAL PAGE NUMBER |
| DeAllocateRDD | DEALLOCATE AN RDD FROM FPGA VIRTUAL MEMORY BY CLEARING THE RDD ENTRY IN THE RDD TABLE | ID | SIZE |
| DeAllocateRDDPage | DEALLOCATE AN RDD FROM FPGA DRAM AND MARK SPACE AS FREE | ID | VIRTUAL PAGE NUMBER |
| ReceiveRDD | INITIALIZE THE FMMU FOR RDD STREAM COPY OPERATION FROM SERVER DRAM TO FPGA DRAM | ID | SIZE |
| SendRDD | INITIALIZE THE FMMU FOR RDD STREAM COPY OPERATION FROM FPGA DRAM TO SERVER DRAM | ID | SIZE |
| ReceiveRDDPage | INITIALIZE THE FMMU FOR RDD PAGE STREAM COPY OPERATION FROM SERVER DRAM TO FPGA DRAM | ID | VIRTUAL PAGE NUMBER |
| SendRDDPage | INITIALIZE THE FMMU FOR RDD PAGE STREAM COPY OPERATION FROM FPGA DRAM TO SERVER DRAM | ID | VIRTUAL PAGE NUMBER |

| VALID BIT | VIRTUAL BASE ADDRESS | SIZE |
|---|---|---|
| 1 OR 0 | ID SLL 32 | FROM COMMAND ARGUMENT 2 |

| PAGE TABLE SELECTION | PAGE TABLE ENTRY SELECTION | PAGE TABLE ENTRY CONTENT | |
|---|---|---|---|
| RDD TABLE ENTRY NUMBER | VIRTUAL PAGE NUMBER | "PRESENT BIT" | PHYSICAL PAGE NUMBER |

| TEMPLATE | VALID BITS | $(W_1, C_1)$ | $(W_2, C_2)$ | (.......) | $(W_i, C_i)$ | (.......) | $(W_n, C_n)$ | NEXT BLOCK VIRTUAL ADDRESS |

| KEY | NODE1 | NODE2 | NODE3 | NODE4 | TOTAL |
|---|---|---|---|---|---|
| A | 2000 | 4000 | 2500 | 3500 | 12000 |
| B | 1000 | 1100 | 1900 | 400 | 4400 |
| C | 1000 | 1600 | 700 | 2000 | 5300 |
| D | 200 | 900 | 700 | 1300 | 3100 |
| E | 700 | 750 | 850 | 500 | 2800 |
| F | 900 | 950 | 950 | 1200 | 4000 |
| G | 950 | 1000 | 1300 | 950 | 4200 |
| H | 2000 | 2000 | 3000 | 300 | 7300 |
| I | 500 | 1000 | 600 | 400 | 2500 |
| M | 1000 | 1000 | 900 | 900 | 3800 |
| N | 500 | 500 | 400 | 800 | 2200 |
| O | 1500 | 3000 | 1000 | 2200 | 7700 |

| KEY | NODE1 | NODE2 | NODE3 | NODE4 | TOTAL |
|---|---|---|---|---|---|
| A | 2000 | 4000 | 2500 | 3500 | 12000 |
| O | 1500 | 3000 | 1000 | 2200 | 7700 |
| H | 2000 | 2000 | 3000 | 300 | 7300 |
| C | 1000 | 1600 | 700 | 2000 | 5300 |
| B | 1000 | 1100 | 1900 | 400 | 4400 |
| G | 950 | 1000 | 1300 | 950 | 4200 |
| F | 900 | 950 | 950 | 1200 | 4000 |
| M | 1000 | 1000 | 900 | 900 | 3800 |
| D | 200 | 900 | 700 | 1300 | 3100 |
| E | 700 | 750 | 850 | 500 | 2800 |
| I | 500 | 1000 | 600 | 400 | 2500 |
| N | 500 | 500 | 400 | 800 | 2200 |

FIG. 17

|  | NODE1 | NODE2 | NODE3 | NODE4 |
|---|---|---|---|---|
| ASSIGNED KEYS | A,I | O,F,E | H,G,D | C,B,M,N |
| KEYS TOTAL | 14500 | 13900 | 14600 | 15700 |

FIG. 18

METHOD AND SYSTEM FOR PROCESSING BIG DATA

CROSS-REFERENCE TO RELATED APPLICATIONS

This application claims the benefit of U.S. Provisional Patent Application Ser. No. 62/885,251, filed Aug. 10, 2019, which is incorporated herein by reference.

FIELD OF THE DISCLOSURE

The present disclosure relates to big data. More particularly, the present disclosure relates to a big data analytics platform that provides the performance and energy benefits of field programmable gate array (FPGA) acceleration circuits.

BACKGROUND OF THE DISCLOSURE

Big data is a term that describes the large volume of data—both structured and unstructured—that inundates a business on a day-to-day basis. Big data can be analyzed for insights that lead to better decisions and strategic business moves. However, the data sets involved are so voluminous that traditional data processing software just cannot manage them. But these massive volumes of data can be used to address business problems the companies would not have been able to tackle before.

SUMMARY

Aspects of the disclosure include a demand paging system for distributed big data caching comprising: a server node having a server processor, a server memory and an accelerator; the accelerator having an integrated circuit with a memory management unit, an interface, a first memory, a second memory and a third memory; the memory management unit is capable of allocating virtual memory for data set partitions for input or for output of data pages generated during acceleration, wherein the first memory is capable of storing virtual addresses of the data set partitions; the memory management unit is capable of allocating the data pages in the third memory corresponding to virtual pages of data sets with virtual addresses stored in the first memory; the second memory is configured for storing information about the data pages accessed by the accelerator; the server memory and the third memory are capable of storing and persisting input and output the data set partitions across application execution stages; the interface is located between acceleration software contained in the server memory which is capable of being executed by the server processor, wherein the interface is capable of copying input and output streams of the data pages between the accelerator and the server memory; and the integrated circuit capable of signaling data page faults to the acceleration software whenever the data pages need to be read from the server memory.

Further aspects of the disclosure include a demand paging method for distributed big data caching in a server having a server processor and a server memory, the method comprising: allocating virtual memory in the server by an accelerator having an integrated circuit with a memory management unit, an interface, a first memory, a second memory and a third memory, wherein the memory management unit is capable of allocating the virtual memory for data set partitions for input data or output of data pages generated during acceleration; storing virtual addresses of the data set partitions in the first memory; allocating by the memory management unit the data pages in the third memory corresponding to virtual pages of data sets with virtual addresses stored in the first memory; storing information about the data pages accessed by the accelerator in the second memory; storing and persisting input and output of the data set partitions across application execution stages in the server memory and the third memory; copying input and output streams of the data pages at an interface between the accelerator and the server memory; and signaling data page faults to the accelerator whenever the data pages need to be read from the server memory.

BRIEF DESCRIPTION OF THE DRAWINGS

Aspects of the embodiments of this disclosure are illustrated by way of example. While various details of one or more techniques are described herein, other techniques are also possible. In some instances, well-known structures and devices are shown in block diagram form in order to facilitate describing various techniques.

A further understanding of the nature and advantages of examples provided by the disclosure can be realized by reference to the remaining portions of the specification and the drawings, wherein like reference numerals are used throughout the drawings to refer to similar components. In some instances, a sub-label is associated with a reference numeral to denote one portion or part of a larger element or one of multiple similar components. When reference is made to a reference numeral without specification to an existing sub-label, the reference numeral refers to all such similar components.

As shown in FIG. 3, a driver program 300 acts as the central coordinator of the execution and communicates with a large number of worker nodes 101 having executors 101a.

FIG. 4 shows a code example written in Scala programming language to illustrate how Spark is capable of generating an execution plan with execution stages from the program DAG and how it then schedules and dispatches tasks to the executors 101. This example is a distributed word count program, which generates a list of unique words that occur in a distributed text file and counts how many times each word is used in the file.

FIG. 5 shows a table of how Spark executes the word count program using a small input text file as illustration and 2 worker nodes 101.

FIG. 9 shows RDD table 808 with a list of commands that can be processed by the FMMU 800.

FIG. 17 shows a sorted table.

FIG. 18 shows a table illustrating that each node will have computed the same key assignment after step 4 in the load-balancing process.

DETAILED DESCRIPTION OF THE DISCLOSURE

Figure 1A:
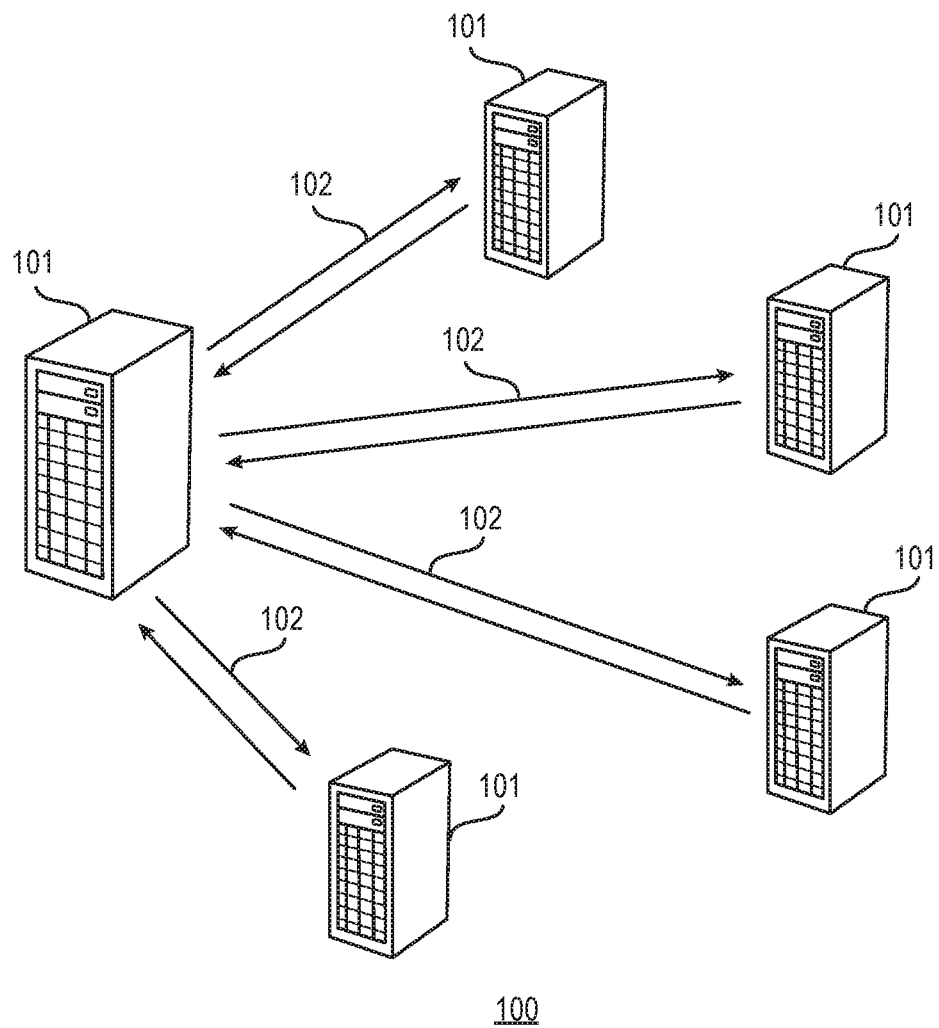
FIG. 1A shows an example of cluster of servers/computers arranged in an Apache Spark architecture.

Below are example definitions, conventions and terms that are provided only for illustrative purposes in this disclosure below and should not be construed to limit the scope of the embodiments disclosed herein in any manner.

"Accelerated Functions" or "Acceleration" is used herein to mean increasing the speed and performance of large-scale data systems (i.e., big data systems).

An Acceleration Card is a hardware/software platform designed to enable customized FPGA-based acceleration of networking, storage and computing workloads.

Apache Hadoop is a collection of open-source software utilities that facilitate using a network of many computers to solve problems involving massive amounts of data and computation. It provides a software framework for distributed storage and processing of big data using the MapReduce programming model.

Apache Spark is a general-purpose cluster-computing platform configured for improved performance over a Hadoop Map-Reduce cluster-computing platform. Apache Spark extends the Hadoop Map-Reduce model to support richer operations, more types of computations such as interactive queries and stream processing, and the ability to perform computations on data cached in dynamic random access memory (DRAM).

"combineByKey" is an optimization function in Apache whereby values are merged into one value at each partition (a logical chunk of a large distributed data set) then each partition value is merged into a single value.

A computer cluster (or cluster) is a set of loosely or tightly connected computers that work together so that, in many respects, they can be viewed as a single system. Unlike grid computers, computer clusters have each node set to perform the same task, controlled and scheduled by software.

"Demand paging" is a type of swapping done in virtual memory systems. In demand paging, the data is not copied from the disk to the random access memory (RAM) until needed or demanded by some program. The data will not be copied when the data is already available on the memory.

Directed Acrylic Graphic (DAG) in Apache Spark is a set of vertices and edges, where vertices represent the RDDs and the edges represent the operation to be applied on RDD. In Spark DAG, every edge directs from earlier to later in the sequence.

"flatMap" is a function in Apache that returns an RDD by applying a function to each element of the RDD but output is flattened.

Middleware is software that provides common services and capabilities to applications. Data management, application services, messaging, authentication, and API management are all commonly handled by middleware. Middleware can support application environments that work smoothly and consistently across a highly distributed platform.

reduceByKey is a Spark function which merges the values for each key using an associative reduce function. Basically reduceByKey function works only for RDDs which contains key and value pairs kind of elements (i.e., RDDs having tuple or Map as a data element). It is a transformation operation which means it is lazily evaluated.

Resilient Distributed Datasets (RDD) is a fundamental data structure of Spark. It is an immutable distributed collection of objects. Each dataset in RDD is divided into logical partitions which may be computed on different nodes of the cluster.

A tuple is a finite ordered list of elements.

FIG. 1A shows an implementation of an Apache Spark (or Spark) system on a cluster 100 of servers (or worker node servers) 101 communicating through a network 102. FIG. 1A shows Spark is working in master-worker architecture. Generally speaking, master node server 101 distributes the jobs to worker node servers 101.

Figure 1B:
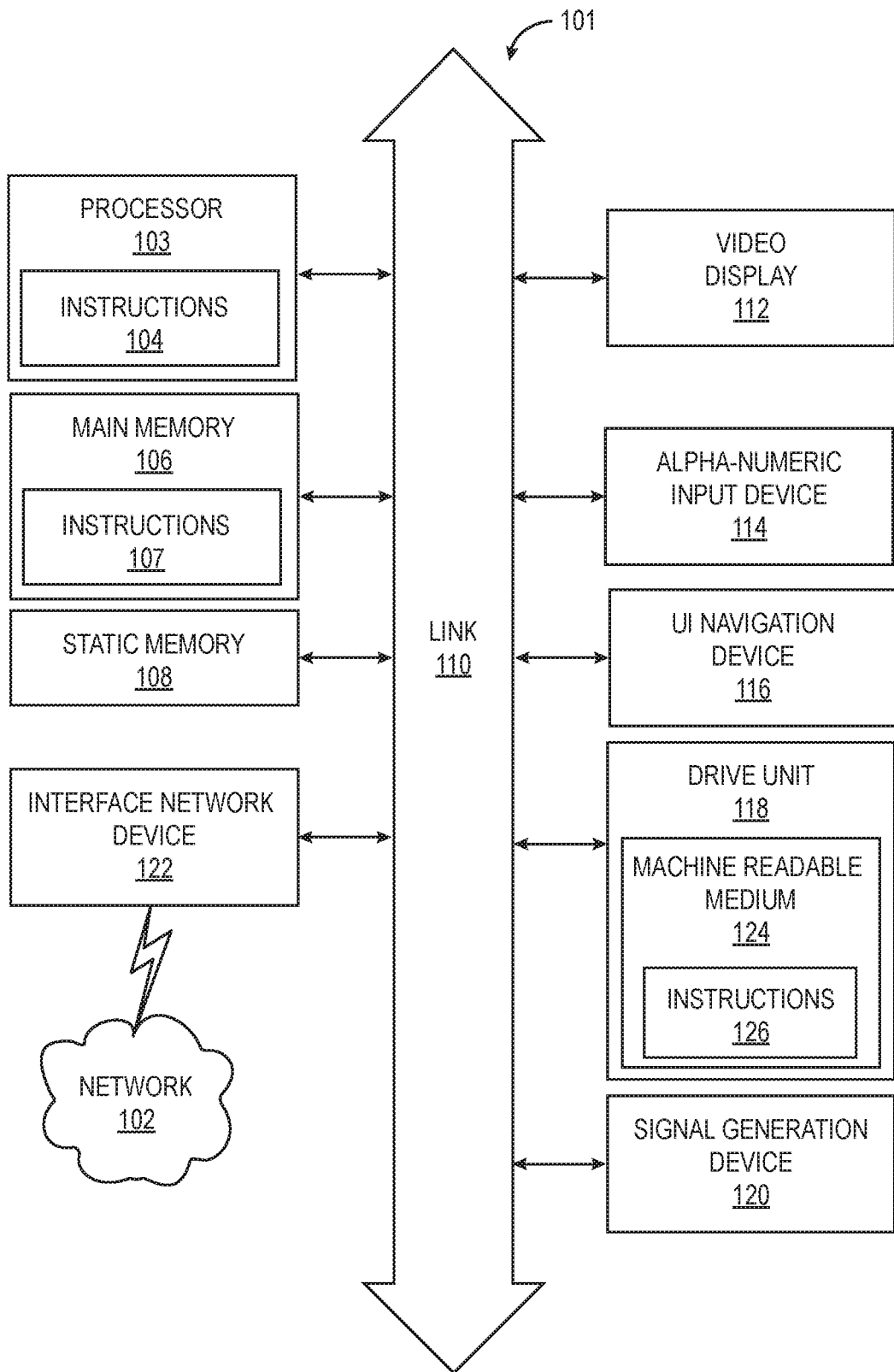
FIG. 1B shows a detailed view of a server/computer system 100 that can operate as part of a cluster computing framework mode as described with reference to FIGS. 2-18.

FIG. 1B shows a computer server system 101 that can operate as a cluster computing framework mode as described with reference to FIGS. 1A and 2-18. One or more processors (or processor-implemented modules) 103 receive instructions 104 (e.g., software) for causing computer sever system 101 to perform any one or more of the methodologies discussed herein that may be executed. In a networked deployment as illustrated in FIG. 1A, the computer server system 101 may operate in the capacity of a server machine or a client machine in a server-client network environment, or as a peer machine in a peer-to-peer (or distributed) network environment. The computer server system 101 may be a server computer, a client computer, a user personal computer (PC), a tablet computer, a laptop computer, a netbook, a set-top box (STB), a user digital assistant (PDA), a cellular telephone, a smartphone, a web appliance, a network router, a network switch, a network bridge, or any machine capable of executing the instructions 104, sequentially or otherwise, that specify actions to be taken by that server. While only a single server 101 and a single processor 103 is illustrated in FIG. 1B, the term "server" and the term "processor" shall also be taken to include a collection of servers and a collection of processors, respectively, that individually or jointly execute the instructions 104 to perform any one or more of the methodologies discussed herein. The performance of certain of the operations may be distributed among the one or more processors 103, not only residing within a single server (or machine) 101, but deployed across a number of machines 101. In some example embodiments, the one or more processors (or processor-implemented modules) 103 may be located in a single geographic location (e.g., within a home environment, an office environment, or a server farm). In other example embodiments, the one or more processors (or processor-implemented modules) 103 may be distributed across a number of geographic locations.

The computer server system 101 includes one or more processors 103 (e.g., a central processing unit (CPU), a graphics processing unit (GPU), a digital signal processor (DSP), a field programmable gate array (FPGA) circuit, an application specific integrated circuit (ASIC), a radio-frequency integrated circuit (RFIC), or any suitable combination thereof), a main memory 106 with stored instructions 107, and a static memory 108, which are configured to communicate with each other via a bus 110. The computer system 101 may further include a graphics display 112 (e.g., a plasma display panel (PDP), a light emitting diode (LED) display, a liquid crystal display (LCD), a projector, or a cathode ray tube (CRT)). The computer system 101 may also include an alphanumeric input device 114 (e.g., a keyboard), a control device 116 (e.g., a mouse, a touchpad, a trackball, a joystick, a motion sensor, or other pointing instrument), a storage unit 118, a signal generation device 120 (e.g., a speaker), and network interface device 122.

The storage unit 118 (e.g., drive unit) includes a machine-readable medium 124 on which is stored instructions 126 (e.g., software) embodying any one or more of the methodologies or functions for operation of the abnormality detection system and method described herein. The instructions 126 may also reside, completely or at least partially, within the main memory 106 as reference 107, within processor 103 (e.g., as reference 104 within the processor's cache memory), or both, during execution thereof by the computer server system 101. Accordingly, the main memory 106 and processor 103 may be considered as machine-readable mediums. The instructions 124 may be transmitted or received over network 102 via network interface device 122.

As used herein, the term "memory" (e.g., 106) refers to a machine-readable medium able to store data temporarily or permanently and may be taken to include, but not be limited to, a hard disk, random-access memory (RAM), DRAM, read-only memory (ROM), buffer memory, flash memory, and cache memory. While the machine-readable medium 124 is shown in an example embodiment to be a single medium, the term "machine-readable medium" should be taken to include a single medium or multiple media (e.g., a centralized or distributed database, or associated caches and servers) able to store instructions. The term "machine-readable medium" shall also be taken to include any medium, or combination of multiple media, that is capable of storing instructions (e.g., software) for execution by a server, such that the instructions, when executed by one or more processors of the machine (e.g., processor 103), cause the machine 101 to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" shall accordingly be taken to include, but not be limited to, one or more data repositories in the form of a solid-state memory, an optical medium, a magnetic medium, or any suitable combination thereof.

Substantial variations may be made in accordance with specific requirements to the embodiments disclosed. For example, customized hardware might also be used, and/or particular elements might be implemented in hardware, software (including portable software such as applets and firmware), or both.

The computer system 101 alternatively could function in a fully virtualized environment. A virtual machine is where all hardware is virtual and operation is run over a virtual processor. The benefits of computer virtualization have been recognized as greatly increasing the computational efficiency and flexibility of a computing hardware platform. For example, computer virtualization allows multiple virtual computing machines to run on a common computing hardware platform. Similar to a physical computing hardware platform, virtual computing machines include storage media, such as virtual hard disks, virtual processors, and other system components associated with a computing environment. For example, a virtual hard disk can store the operating system, data, and application files for a virtual machine. Virtualized computer system includes computing device or physical hardware platform, virtualization software running on hardware platform, and one or more virtual machines running on hardware platform by way of virtualization software. Virtualization software is therefore logically interposed between the physical hardware of hardware platform and guest system software running "in" virtual machine. Memory of the hardware platform may store virtualization software and guest system software running in virtual machine. Virtualization software performs system resource management and virtual machine emulation. Virtual machine emulation may be performed by a virtual machine monitor (VMM) component. In typical implementations, each virtual machine (only one shown) has a corresponding VMM instance. Depending on implementation, virtualization software may be unhosted or hosted. Unhosted virtualization software generally relies on a specialized virtualization kernel for managing system resources, whereas hosted virtualization software relies on a commodity operating system—the "host operating system"—such as Windows or Linux to manage system resources. In a hosted virtualization system, the host operating system may be considered as part of virtualization software.

The computer server system(s) 101 as described herein as including logic or a number of components, modules, or mechanisms. Modules may constitute either software modules (e.g., code embodied on a machine-readable medium or in a transmission signal) or hardware modules. A "hardware module" is a tangible unit capable of performing certain operations and may be configured or arranged in a certain physical manner. In various example embodiments, one or more computer systems (e.g., a standalone computer system, a client computer system, or a server computer system) or one or more hardware modules of a computer system (e.g., a processor or a group of processors) may be configured by software (e.g., an application or application portion) as a hardware module that operates to perform certain operations as described herein.

In some embodiments of the computer server system(s) 101, a hardware module may be implemented mechanically, electronically, or any suitable combination thereof. For example, a hardware module may include dedicated circuitry or logic that is permanently configured to perform certain operations. For example, a hardware module may be a special-purpose processor, such as an FPGA or an ASIC. A hardware module may also include programmable logic or circuitry that is temporarily configured by software to perform certain operations. For example, a hardware module may include software encompassed within the general-purpose processor 103 or other programmable processor. It will be appreciated that the decision to implement a hardware module mechanically, in dedicated and permanently configured circuitry, or in temporarily configured circuitry (e.g., configured by software) may be driven by cost and time considerations. Accordingly, the phrase "hardware module" should be understood to encompass a tangible entity, be that an entity that is physically constructed, permanently configured (e.g., hardwired), or temporarily configured (e.g., programmed) to operate in a certain manner or to perform certain operations described herein. As used herein, "hardware-implemented module" refers to a hardware module. Considering embodiments in which hardware modules are temporarily configured (e.g., programmed), each of the hardware modules need not be configured or instantiated at any one instance in time. For example, where a hardware module comprises a general-purpose processor 103 configured by software to become a special-purpose processor, the general-purpose processor 103 may be configured as respectively different special-purpose processors (e.g., comprising different hardware modules) at different times. Software may accordingly configure a processor 103, for example, to constitute a particular hardware module at one instance of time and to constitute a different hardware module at a different instance of time. Hardware modules can provide information to, and receive information from, other hardware modules. Accordingly, the described hardware modules may be regarded as being communicatively coupled. Where multiple hardware modules exist contemporaneously, communications may be achieved through signal transmission (e.g., over appropriate circuits and buses) between or among two or more of the hardware modules. In embodiments in which multiple hardware modules are configured or instantiated at different times, communications between such hardware modules may be achieved, for example, through the storage and retrieval of information in memory structures to which the multiple hardware modules have access. For example, one hardware module may perform an operation and store the output of that operation in a memory device to which it is communicatively coupled. A further hardware module may then, at a later time, access the memory device to retrieve and process the stored output. Hardware modules may also initiate communications with input or output devices, and can operate on a resource (e.g., a collection of information).

The various operations of example methods described herein may be performed, at least partially, by one or more processors 103 that are temporarily configured (e.g., by software) or permanently configured to perform the relevant operations. Whether temporarily or permanently configured, such processors may constitute processor-implemented modules that operate to perform one or more operations or functions described herein. As used herein, "processor-implemented module" refers to a hardware module implemented using one or more processors. Any of a number of distinct but interrelated units or steps from which a program may be built up or into which a complex activity may be analyzed. The program may be a computer program, hardware, software, a software application, a script, or code, can be implemented in any form of processor or written in any form of programming language, including compiled or interpreted languages, or declarative or procedural languages, and it can be deployed in any form, including as a stand-alone program or as a component, subroutine, or other unit suitable for use in a computing environment.

Similarly, the methods described herein may be at least partially processor-implemented, a processor being an example of hardware. For example, at least some of the operations of a method may be performed by one or more processors or processor-implemented modules. Moreover, the one or more processors may also operate to support performance of the relevant operations in a "cloud computing" environment or as a "software as a service" (SaaS). For example, at least some of the operations may be performed by a group of computers (as examples of machines including processors), with these operations being accessible via network 102 (e.g., the Internet) and via one or more appropriate interfaces (e.g., an application program interface (API)).

Some portions of this specification are presented in terms of process or symbolic representations of operations on data stored as bits or binary digital signals within a machine memory (e.g., a computer memory). These processes or symbolic representations are examples of techniques used by those of ordinary skill in the data processing arts to convey the substance of their work to others skilled in the art. As used herein, an "process" is a self-consistent sequence of operations or similar processing leading to a desired result. In this context, processes and operations involve physical manipulation of physical quantities. Typically, but not necessarily, such quantities may take the form of electrical, magnetic, or optical signals capable of being stored, accessed, transferred, combined, compared, or otherwise manipulated by a machine (e.g., server 101). It is convenient at times, principally for reasons of common usage, to refer to such signals using words such as "data," "content," "bits," "values," "elements," "symbols," "characters," "terms," "numbers," "numerals," or the like. These words, however, are merely convenient labels and are to be associated with appropriate physical quantities.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or any suitable combination thereof), registers, or other machine components that receive, store, transmit, or display information. Furthermore, unless specifically stated otherwise, the terms "a" or "an" are herein used, as is common in patent documents, to include one or more than one instance. Finally, as used herein, the conjunction "or" refers to a non-exclusive "or," unless specifically stated otherwise.

This disclosure details a system and method having a hardware and software platform architecture using Field Programmable Gate Arrays (FPGA) hardware, big data analytics and machine learning applications running on distributed, cluster-computing frameworks, such as Spark. Cluster computing is a form of computing in which a group 100 of computer server systems 101 are linked together so they can work as a single entity. Spark is an open-sourced distributed general-purpose cluster-computing framework. Spark provides an interface for programming entire clusters with implicit data parallelism and fault tolerance. The architecture is configured as a response to serious challenges facing processing of big data in corporate and web hosting data centers. The term "big data" as used herein may range in size from a few dozen terabytes to many petabytes of data in a single data set (or data sets). More specifically, for exemplary purposes, the data may be in the range of 1,024 terabytes to 1,024 petabytes. As the number of connected computing devices increases at a fast pace, the data arriving into data centers from millions and even billions of computing devices increases as well. Corporations continue to identify new opportunities and methods to analyze and benefit from the ingested data, and data scientists continue to invent new and improved processes to gain new insights and benefits from the saved data. The dynamic and changing nature of many of these processes has made distributed programming frameworks such as Spark the preferred choice of software industry. However, the performance and energy demands needed for processing larger and larger amounts of data, using more and more sophisticated processes, have become a serious challenge to the compute capacity available within the electric power and cooling constraints of corporate and public data centers.

FPGAs have an advantage over multicore processors and general-purpose graphics processing units (GPUs) because their data path can be dynamically reconfigured to exactly match the executed processes dataflow. This is in contrast to multicore processors and general-purpose GPUs, which implement processes by executing sequences of instructions generated from high-level programs. Modern processors and GPUs use thread-level parallelism to improve performance, giving them an advantage in energy consumption compared to single thread execution. Nevertheless, the fact that each multicore processor thread, or GPU thread is still fundamentally a set of instructions that are repeatedly (e.g., in loops) and sequentially fetched, decoded, and executed, significantly reduces the energy efficiency of these circuits compared to FPGA dataflow circuits in which the process is mapped directly into the gate arrays via the logic functions of the gates and storage elements as well as the connections configured between these gates and storage elements. In other words, FPGA circuits do not suffer the control flow overhead necessary to execute processes implemented in software as a sequence of repeated permutations of a small and simple set of execution steps or instructions.

Since FPGAs are configured to implement processes at the circuits and interconnect level, they require specific configuration expertise. Software developers are typically trained to program multicore processors or general purpose GPUs, using high-level programming languages and libraries supported by sophisticated static compilers, libraries and runtime environments, such as Java runtime and virtual machines. As such, they do not normally have the necessary skills to configure circuits that deploy processes on FPGA chips. To be viable, any new big data analytics FPGA acceleration platform needs to provide better performance at lower energy than conventional multicore servers and general-purpose GPUs, while hiding the complexity of the FPGA circuits and maintaining familiar high-level programming languages and frameworks for the typical software developers.

The system and method described herein features mechanisms from a big data analytics platform that provides the performance and energy benefits of FPGA acceleration circuits, without sacrificing the ease of developing applications on distributed cluster-computing frameworks like Spark. The description of the system and method of this disclosure is organized as follows. First, there is an overview of Spark architecture. Second, there is described a FPGA software acceleration stack and the underneath hardware acceleration platform (e.g., Intel® hardware). Third, mechanisms are described to manage the FPGA memory resources and to support persistent data that can reside (i.e., cached) in the FPGA Dynamic Random Access Memory (DRAM) to be used at a later execution stage by other accelerated operations. Fourth, there is described high performance implementation of flatMap (a function in Apache) pipelined with a combineByKey (another function in Apache) Accelerator Functional Unit.

Figure 2:
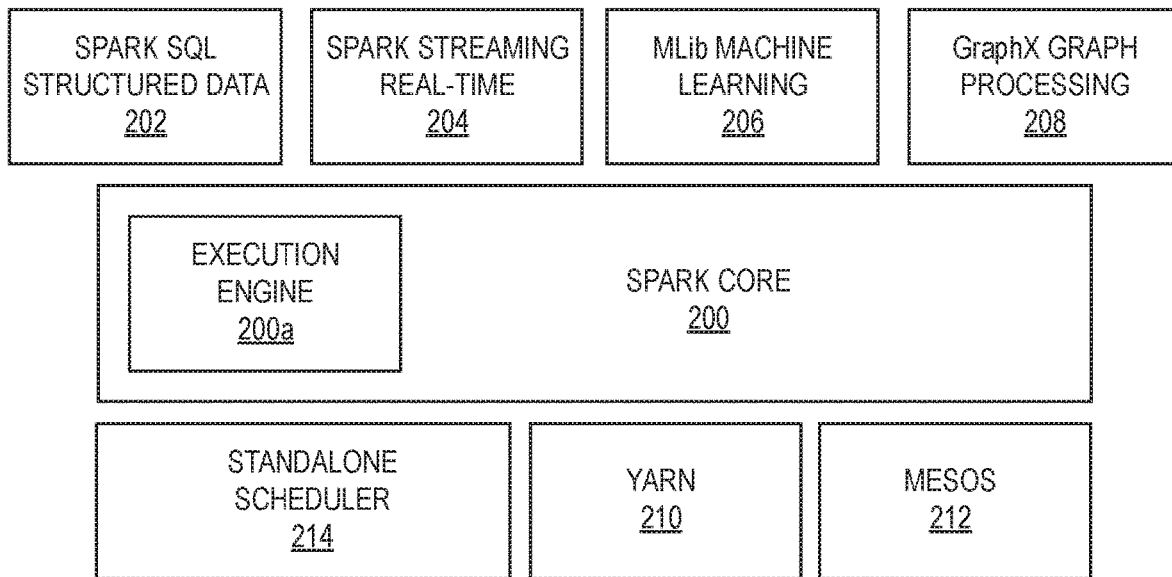
FIG. 2 shows the Apache Spark platform containing multiple tightly integrated components.

Spark is a general-purpose cluster-computing platform configured for improved performance over the Hadoop Map-Reduce cluster-computing platform. Spark extends the Hadoop Map-Reduce model to support richer operations, more types of computations such as interactive queries and stream processing, and the ability to perform computations on data cached in DRAM memory. The Spark platform contains multiple tightly integrated components as shown in FIG. 2. The Spark core 200 is a computational engine responsible for scheduling, distributing and monitoring applications that consist of many computational tasks. Spark can run locally on one machine (or server 101) as shown in FIG. 1B, or on a distributed cluster containing multiple physical computing nodes 101 as shown in FIG. 1A. The cluster deployment mode is of benefit since it is the high performance platform required to process at high speed complex applications on large amounts of data (i.e., big data).

Spark includes multiple software packages that run on the Spark core execution engine 200a (which resides on a server 101 as shown in FIG. 1B). These are Spark Structured Query Language (SQL) 202, Spark Streaming real-time 204, Spark machine learning library (MLib) 206 and Spark graph processing (GraphX) 208, which are specialized for working and querying structured data, processing live streams of data, developing machine-learning processes, and/or manipulating graphs, respectively. Underneath the execution engine 200a, Spark runs efficiently and can scale up to thousands of compute nodes 101 per cluster using variety of cluster managers, including Hadoop Yarn 210, Apache Mesos 212 and a simple cluster manager included with Spark itself called the Standalone Scheduler 214.

Every application in Spark consists of what is called a driver program. The driver program contains the application main function and defines resilient distributed datasets (RDDs) on the cluster. It then applies parallel operations on them to create intermediate RDDs, output RDDs, or other types of output data formats from these RDDs. Driver programs access Spark through a SPARKCONTEXT object (i.e., a software bundle of variables and related methods), which represents a connection to the Spark execution engine 200a and the compute cluster.

An RDD is basically an immutable collection of distributed data objects. All Spark computations involve combinations of the following operations: creating RDDs from inputs, transforming RDDs into new intermediate RDDs, or operating on RDDs to compute outputs. Each RDD is split into multiple partitions, which may be computed on different compute nodes 101 on the cluster 100 in parallel, with each node 101 performing the same operations on its own partition. Programmers create RDDs by loading an external data set, or by splitting and distributing a collection of objects in the driver program. Operations that create new RDDs are called transformations, while operations that compute outputs from RDDs are called actions. For example, one common transformation is filtering data based on some predicate. An example of an action is count ( ), which outputs the total number of objects in an RDD. Outputs of transformations are RDDs stored on hard disk, or cached in DRAM of the compute nodes 101 in the cluster, while outputs of actions are returned to the driver program or saved on an external storage file system.

Spark evaluates transformations on RDDs lazily and does not begin execution of transformations until it reaches an action. This is called lazy evaluation. When a programmer loads an RDD from a file, or calls a transformation operation in the driver program, Spark does not perform these operations immediately. Instead, it records internally metadata to remember that these operations have been requested. The RDDs at this time do not consist of data, but rather consist of instructions that produce the RDD data. When Spark encounters an action, it will perform at this time the instructions that are needed to produce the RDD data required to generate and deliver the action output to the driver program. After the action output is delivered, Spark discards the RDD data it has computed (unless an RDD is defined by the programmer as persistent and in this case the RDD data is cached in DRAM or saved on hard disk). When Spark encounters another action, it may have to evaluate again any RDDs it needs to compute this new action.

Figure 3:
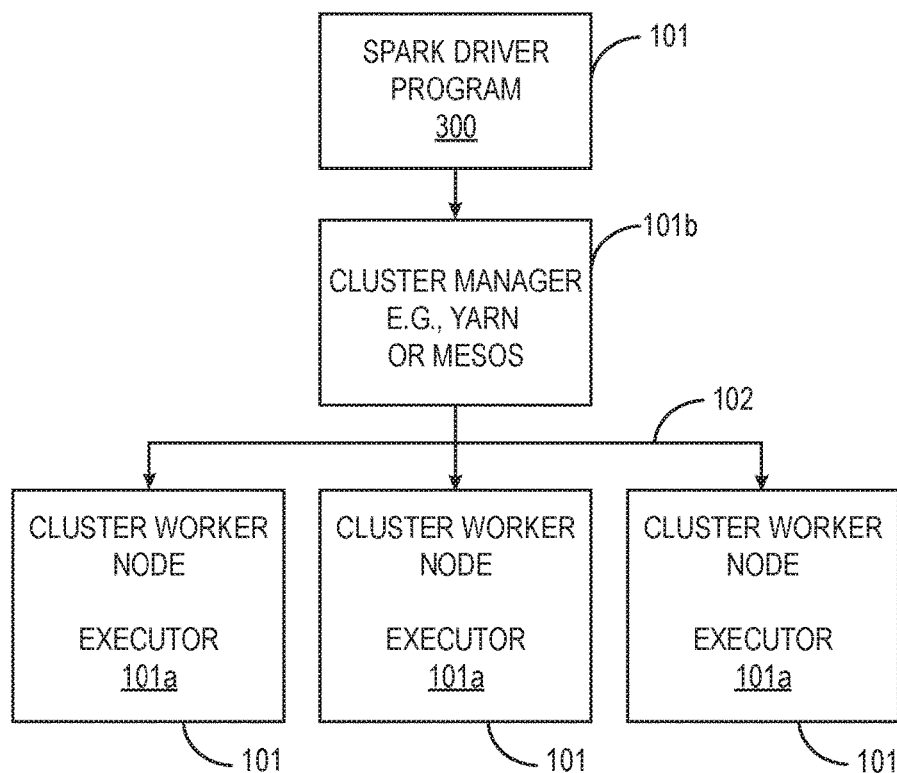
FIG. 3 shows the master/slave architecture of the Apache Spark platform.

The following section explains the runtime architecture of Spark when executing a distributed application on a cluster 100. In distributed mode, Spark uses master/slave architecture as illustrated in FIG. 1A and FIG. 3. A driver program 300 on a server 101 acts as the central coordinator of the execution and communicates with a large number of cluster worker nodes 101 (server nodes 101 in FIG. 1A) having executors 101a. The driver 300 runs within its own Java process and so does each executor 101a. The driver 300 and executors 101a process together to form the Spark application. The Spark application is launched on a cluster 100 using a cluster manager 101b such as Hadoop Yarn, Apache Moses, or Spark Standalone scheduler (see FIGS. 2 and 3). The driver 300 is the process that executes the main ( ) method of the user program. It creates SPARKCONTEXT, creates RDDs, and performs transformations and actions. SPARKCONTEXT is a client of Spark's execution environment and it acts as the master of the Spark application. SPARKCONTEXT sets up internal services and establishes a connection to a Spark execution environment. When the driver 300 process runs, it converts the user program into tasks, and schedules tasks on executors 101a.

A Spark program can be logically represented as a directed acyclic graph (DAG) of operations. When the driver 300 program runs, it converts this DAG into a physical execution plan. In the process, Spark performs multiple optimizations, including pipelining transformations to merge them together. Spark determines which transformations can be pipelined, merged and executed together by splitting the execution plan into a set of stages based on data dependencies between operations. When an operation is to compute a new RDD partition on one executor worker node 101, and the operation depends only on other RDD partitions located on the same node 101, this dependency is called a local dependency. On the other hand, if the operation depends on data from other RDD partitions on other executor nodes 101 in the cluster 100, this dependency is called a cluster dependency. Cluster dependencies are a lot more expensive to perform since they require shuffling data across cluster nodes 101. Spark places operations with local dependencies in the same stage of execution and merge them to execute together on the same executor process. Spark assigns operations with cluster dependencies to different stages. What determines the stage boundaries in Spark are therefore data shuffle operations. An example of an operation that requires data shuffle is reduce( ).

FIG. 4 shows a code example (left box 400) written in Scala programming language to illustrate how Spark is capable of generating an execution plan with execution stages from the program DAG and how it then schedules and dispatches tasks to the executors 101a. This example is a distributed word count program, which generates a list of unique words that occur in a distributed text file and counts how many times each word is used in the file. The first line in the example loads the text file into an RDD called input. The second line applies Spark flatmap transformation to split each line into words RDD. Spark flatMap expresses a one-to-many transformation that transforms each element to 0 or more elements. However, the result is not a collection of collections; it's flattened by concatenating the results into the final collection. The third line maps each word in the words RDD to the ordered pair tuple (word, 1). The fourth line computes the resulting RDD using the reduceByKey action operation. Spark RDD reduceByKey function merges the values for each key using an associative reduce function. Basically reduceByKey function works only for RDDs which contains key and value pairs kind of elements. Spark splits the reduceByKey operation into a local combineByKey in Stage 1 (402 in FIG. 4), followed by cluster-wide reduceByKey 404 that requires shuffling data across the cluster nodes 101. Since the combineByKey is a local operation, Spark merges it with load input RDD, flatMap and map operations to form the first stage 402. Spark task scheduler then dispatches a set of tasks, one per partition to the worker nodes 101 in the cluster, with each task containing all the operations in stage 1 (402), but with a different text file partition as an input. All these tasks execute in parallel on the cluster worker nodes 101, since all operations within the stage are local and do not require shuffling data between cluster worker nodes 101.

After stage 1 (402) of the program execution completes, Spark prepares for shuffling data as follows. Each worker node 101 splits it's stage 1 output by key into n subsets, where n is the number of worker nodes 101 in the cluster, writing these n subsets to its hard disk. The cluster is now ready for the data shuffle and the reduceByKey operation of stage 2 (404). During the execution of stage 2 (404), each cluster worker node 101 is responsible for a subset of the keys. Each worker executes the stage 2 task by reading its key tuples from the hard disk of each of the nodes 101 and performing the reduce operation for each key. Note that the shuffle operation is a serialization point during Spark execution that requires a significant delay since it involves splitting and writing data to the cluster hard disk of each node 101 followed by each node 101 reading a subset of its input data for the next execution stage from each of the worker nodes 101 hard disk over the cluster data communication network 102.

FIG. 5 shows a table of how Spark executes the word count program using a small input text file as illustration and two worker nodes 101. The first row shows the text file. Rows 2 and 3 show the input RDD partitions from the text file and other RDDs generated in stage 1 of the execution on worker nodes 1 and 2 respectively. Particularly of interest is the optimization in which Spark performs combineByKey on each worker node 101, which is effectively a local reduceByKey operation. This is done since it is better for performance. For example, copying the pair (Spark 4) once from worker node 2 to worker node 1 takes less time than copying the pair (Spark 1) 4 times, which would be necessary without the local combineByKey local operation.

Rows 4 and 5 of FIG. 5 show the shuffle mechanism performed on worker nodes 1 and 2. First, each node splits its wordPairs RDD partition into two files and writes the two files on the local hard disk. In the example, file 1 in each worker node 101 contains word pairs that start with a character in the range n to z, while file 2 contains all word pairs that start with a character in the range a to m. Up until this point, no data has been yet copied across the cluster nodes 101. The actual copy of data is read-initiated when the reduceByKey operation in stage 2 executes, as shown in rows 6 and 7. Worker node 1 reads file 1 from worker node 2 and performs its reduceByKey stage 2 task with the data in its own file 1. Worker node 2 reduceByKey it's own file 2 with file 2 that it copies from the hard disk of worker node 1 over the cluster interconnect network 102.

Software Acceleration Stack and Hardware Platform

Figure 6:
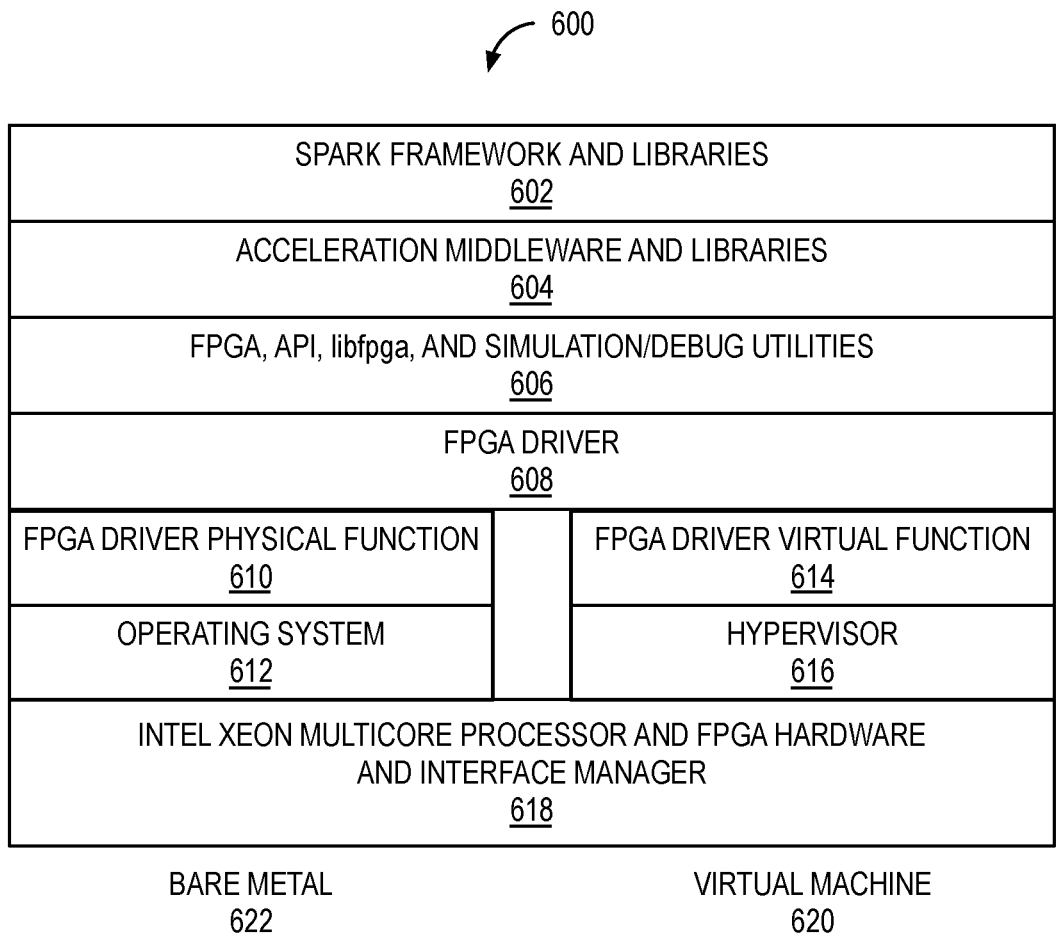
FIG. 6 shows a hardware platform for a field programmable gate array (FPGA) acceleration of Spark.

FIG. 6 shows a hardware acceleration platform 600 for FPGA acceleration of Spark that sits on servers 101. This platform 600 may be based, for example, on the Intel® acceleration stack for Xeon® processor (this is processor(s)

Figure 7:
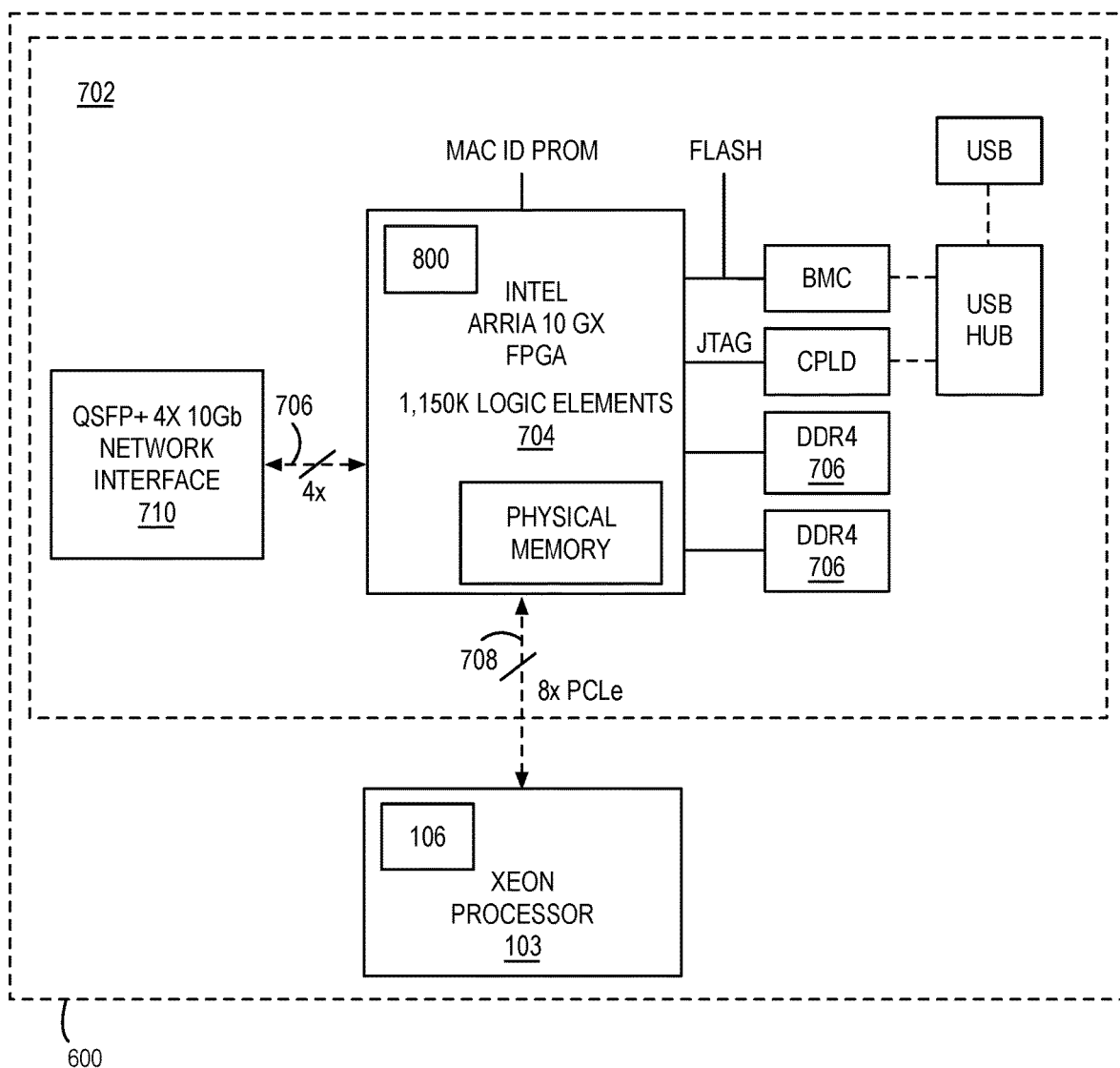
FIG. 7 shows a block diagram of an Intel® Arria® 10 GX FPGA acceleration card 702.

103 in FIG. 1B) with FPGA card (shown in detail as reference 702 in FIG. 7). The Intel® FPGA acceleration stack uses technology called Open Programmable Acceleration Engine (OPAE). OPAE technology is a software layer that provides a consistent application program interface (API) across FPGA product generations and platforms. It is configured for minimal software overhead and latency, while providing an abstraction for hardware-specific FPGA resource details. Intel® provides various Peripheral Component Interconnect Express (PCIe) connected programmable acceleration cards such as the Intel® Arria 10 GX FPGA card (reference 702 in FIG. 7).

Spark with its driver programs 300, execution engine 200a and libraries is shown in FIG. 6 at the top layer 602 of the software stack for platform 600. Spark code does not interact with the OPAE engine directly. Instead, it communicates with OPAE through the acceleration middleware layer and libraries 604. The acceleration middleware is computer software contained in memory (e.g., 104, 106 and/or 107) that is executable on computer hardware (e.g., processor 103). The middleware layer 604 performs runtime scheduling, RDD memory management and other optimizations that are unique to the FPGA hardware acceleration platform 600. FIG. 6 shows Intel OPAE software layers 606 sitting between the middleware layer 604 and the FPGA acceleration hardware 608. OPAE features FPGA application programming interface (API) provided through a lightweight user-space library (libfpga) layer. This layer 606 also includes guides, command-line utilities, acceleration functional unit (AFU) simulation environment and sample codes. Below the FPGA API and libfpga layer 606 is the OPAE FPGA driver layer 608, connected into a Linux kernel. The driver layer 608 has an FPGA driver physical function 610 and operating system 612. The driver layer 608 also has FPGA driver virtual function 614 and hypervisor 616 (or virtual machine monitor which runs virtual machines). Intel acceleration software stack supports both virtual machines 620 and bare-metal 622 platforms running on hardware layer 618 that consists of a server node 101 (e.g., Intel® Xeon® multicore processor node) connected through an interface manager to a peripheral component interconnect express (PCIe) bus 708 to the FPGA hardware acceleration card 702 (shown in FIG. 7).

FIG. 7 shows a block diagram of the hardware acceleration platform 600 at a server node 101 with a processor 103 ((e.g., server Intel® Xeon® processor) and an attached acceleration card (e.g., the Intel® Arria® 10 GX FPGA acceleration card) 702. Intel® provides multiple FPGA acceleration PCIe cards 702 with different logic gates capacity and on-board DRAM size. Acceleration card 702 has an FPGA chip 704 with logic elements, a PCIe bus 706 connecting the internal elements of the acceleration card 702, PCIe interface 708 to the Xeon® processor 103, and a quad small form factor pluggable (QSFP+) network interface 710. In the hardware acceleration platform 600, the PCIe interface 708 is used to schedule and execute acceleration tasks on the FPGA chip 704, and to transfer commands and RDD data between the FPGA acceleration card 702 and the server 101 memory 106 (e.g., DRAM or hard disk). There is also used the QSFP+ network interface 710 to transfer data between the FPGA accelerators located on each of the different cluster nodes 101, directly and without needing any assistance from the node central processing unit (CPU). This reduces data transfer delays between nodes 101, especially critical during data shuffle operations. In alternative embodiments, different integrated circuits technologies may be used of the hardware acceleration platform in shown in FIG. 7. For example, a higher performance implementation can be built by replacing the FPGA acceleration card 702 with a card that uses an application specific integrated component (ASIC) with the same processing functions as those contained in the FPGA hardware. In another high performance embodiment, the acceleration functions implemented here within the FPGA can be integrated on the same silicon computer chip with the computer processing unit (CPU) of the multicore server 101. In such implementation, the PCIe bus interface 708 would be replaced by lower latency and higher bandwidth on-chip bus interface, yielding even better acceleration performance.

Managing Memory Caching and RDD Persistence on the FPGA Acceleration Card

Spark discards RDD data that it computes by default, unless the programmer defines an RDD as persistent. In this case, the RDD data is cached in server memory 106 (e.g., DRAM or saved on a hard disk), depending on a persistence attribute defined by the programmer. On the FPGA hardware acceleration platform 600, there is desired to keep persistent RDDs in the FPGA on-board DRAM 706 (e.g., Double Data Rate 4 (DDR4) DRAM) for future processing by other accelerated operations. Otherwise, persistent RDDs have to be copied back and forth between the FPGA on-board DRAM 706 and the server CPU DRAM 106 over the PCIe interface 708. The large amount of data transferred back and forth in big data operations makes this especially undesirable.

In another optimization performed by the platform middleware layer runtime scheduler, selected RDDs can be implicitly managed as persistent RDDs in the FPGA on-board DRAM 706, even though the programmer might not have defined these RDDs to be persistent. This optimization minimizes copying RDDs unnecessarily over the PCIe interface 708 between the server CPU DRAM 106 and the FPGA on-board DRAM 706, as in the case of explicit persistent RDDs. The middleware scheduler performs this implicitly instead of relying on the programmer. This way, the hardware accelerator platform 600 hides the complexity and low level acceleration details from the programmer, thus providing better performance without increasing the difficulty of Spark applications development.

It is also important for performance to provide an FPGA chip data cache to hide the high latency of the FPGA DRAM 706. Last but not least, it is important for ease of programming to have the platform middleware and FPGA hardware manage the limited physical capacity of the FPGA DRAM 706, by automatically swapping pages between the memory 106 (e.g., hard disk) located on server 101 and the FPGA DRAM 706, as needed based on the accelerated operations access patterns of RDDs.

Figure 8:
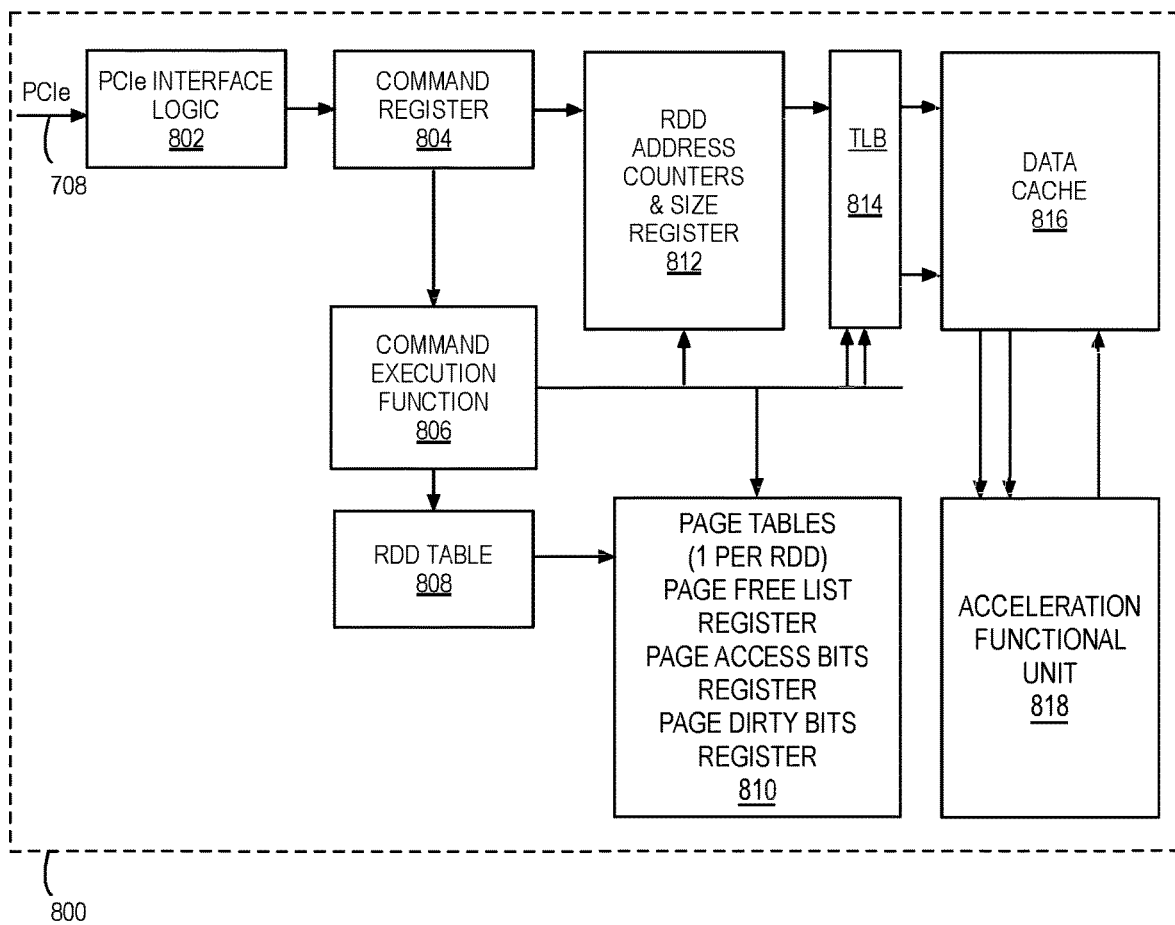
FIG. 8 shows a block diagram of this FPGA memory management unit (FMMU) 800.

In order to support the above functions and optimizations, there is implemented a memory management unit 800 on the FPGA chip 704 of the platform 600. Memory management unit 800 is represented by a block figure in FIG. 7 and in detail in FIG. 8. FIG. 8 shows a diagram of the FPGA memory management unit (FMMU) 800. The FMMU 800 supports virtual memory using "Demand Paging". The FMMU 800 creates memory space for RDD data using its own virtual memory address space (unrelated to the CPU virtual memory space). The FMMU virtual memory is organized as contiguous blocks of at least 2 Megabytes, which matches in size a large page supported by Intel Xeon® processors. Each of these blocks gets mapped to a physical page in the FPGA on-board DRAM 706, whenever:

1) an access to this page is demanded by an accelerator functional unit (AFU), and the page is not in the FPGA DRAM 706, or 2) when a command to allocate an RDD page is received from the middleware 604.

The middleware 604 acts as the master controller of the FMMU 800. The middleware 604 runtime scheduler determines and tracks explicit or implicit RDDs that reside on the FPGA acceleration card 702 at any time. It dispatches commands to allocate or deallocate RDDs in FPGA DRAM memory 706, or to copy RDD pages between the server CPU DRAM 106 and the FPGA DRAM 706. These commands arrive to the FMMU 800 from the middleware 604 over the PCIe interface 708 shown on the top left corner of FIG. 8. A PCIe interface logic functional block 802 extracts a command from the PCIe interface 708 and writes this command in a special command register 804. The command is forwarded from the command register 804 to the command execution functional unit 806 that processes this command using a special microcode.

FIG. 9 shows RDD table 808 with a list of commands that can be processed by the FMMU 800. Column 1 of the RDD table 808 contains command names and column 2 describes operations performed by each command. Each command carries with it two arguments (Argument 1, Argument 2) shown in columns 3 and 4. The size and page number argument in column 4 represent the size of the RDD and the number/location of the RDD page within the RDD, respectively. The identification (ID) argument in column 3 uniquely identifies an RDD and its partition as follows. The middleware 604 and the FMMU hardware 800 uniquely identify each RDD by concatenating a pair of IDs: RDD ID that identifies an RDD, and a process ID that identifies the RDD executor process. The process ID is needed to uniquely identify different partitions of the same RDD within the same physical compute node 101 in a cluster 100. This is a situation that could arise in cluster configurations when more than one executor 101a runs on the same physical multicore compute node 101. In one possible FMMU 800 implementation, for example, one process ID bit and two RDD ID bits would be needed to support two executors 101a within a server node 101, and be able at any given time to persist 4 different RDDs per executor 101a in the FPGA DRAM 706.

In some cases, the middleware 604 may not know ahead of time the size of the RDD that needs to be allocated. Using one example, this can arise when the RDD is an output RDD from an accelerated operation. In such situations, the middleware 604 is required to pass a value of 0 in the size argument. The actual size of the RDD will be later determined as a result of the execution of the accelerated operation, and an appropriate number of physical pages will be dynamically allocated during the execution of the accelerated operation based on access patterns, dynamically managed through the FMMU 800 demand paging mechanism.

AllocateRDD Command Execution

The FMMU 800 executes each of the commands and it maps virtual to physical addresses to allow accelerator cards 702 to access RDD data. When the FMMU 800 executes AllocateRDD command, it uses the ID argument in the command to index an entry in the RDD table 808 (see FIG. 9). Referring to the table of FIG. 10, each RDD table entry consists of 3 binary fields: 1) valid bit, 2) RDD virtual base address, and 3) RDD size. The FMMU 800 sets the valid bit in the RDD entry to 1, writes the size of the RDD from the command second argument into the entry and then writes the virtual based address in the RDD table entry. The FMMU 800 in the hardware acceleration platform 600 creates the RDD virtual base address by performing a logical shift left operation (SLL) of the ID bits from the command argument. The shift amount is 32, setting a maximum RDD size of 4 Gigabytes. Other implementations could set the shift amount differently based on the maximum RDD size targeted in the hardware acceleration platform 600 specification. Finally, the FMMU 800 copies the virtual base address into an RDD counter register 812, making the FMMU 800 ready for the acceleration card 702 to start accessing the RDD. It should be noted that the FMMU 800 executes AllocateRDD lazily and does not allocate physical memory pages for the RDD. Physical memory page allocation and virtual to physical memory mappings happen on demand, or explicitly when the FMMU 800 executes the AllocateRDDPage command, as described next.

AllocateRDDPage Command Execution

Figures 10, 11, 12:
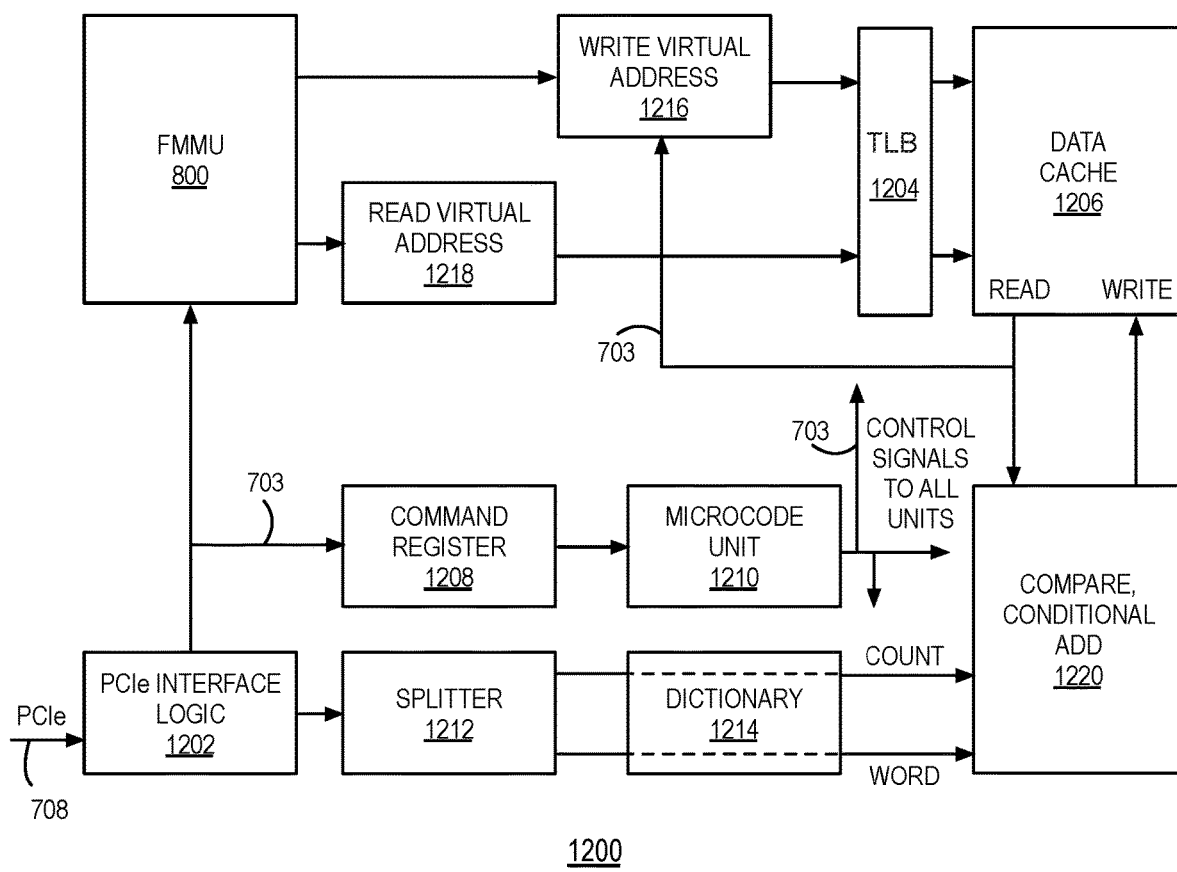
FIG. 10 shows a resilient distributed datasets (RDD) table entry.
FIG. 11 shows a table with the page table entry format and how a page table entry is selected based on RDD and virtual page number.
FIG. 12 shows a block diagram of an Accelerator Functional Unit (AFU).

The FMMU 800 executes AllocateRDDPage command by allocating a page in the DRAM 706 and mapping the page virtual address to the allocated DRAM page physical address. The FMMU 800 uses the following hardware resources to allocate physical pages in the DRAM 706 and to map virtual to physical page addresses:

1. A set of page tables that includes one page table for each RDD entry in the RDD table.
2. Each page table contains N page table entries (PTE), where N=MaxRDDsize div Psize, where MaxRDDsize is $2^{32}$ and Psize=page size=$2^{21}$ in the current platform specification, which gives N a value=$2^{11}$. Each page table entry contains: 1) a present bit (P), which is set to 1 if and only if a page is in the FPGA DRAM 706, and 2) a physical page number, which is equal to "page physical base address" div page size (page size=$2^{21}$ in the platform implementation). Note that the simplest way to calculate the page number from a virtual or physical address is to logically shift the address right by an amount of 21, which is equivalent to the more costly divide operation. FIG. 11 shows a table with the page table entry format, and how a page table entry is selected based on RDD and virtual page number.
3. Access register shown in block 810 contains one bit for every page in DRAM 706. When a page is read or written by an accelerated operation, its access bit in the access register 810 is set to 1. The access register 810 is reset to 0 periodically. When the FMMU 800 needs to allocate a new RDD page and no DRAM page is free, it selects for replacement a page that has not been accessed recently, determined by the condition that the page access bit is 0.
4. Dirty register shown in block 810 contains one bit for every page in DRAM 706. When a bit in the dirty register 810 has the value 1, it indicates that the corresponding page has been written since the page was allocated in DRAM 706. When replacing such page, the FMMU 800 sends a message to the middleware 604 requesting the page to be saved to the memory (i.e., hard disk) 106 by the middleware 604.
5. Free register also shown in block 810 contains one bit for every page in DRAM 706. A bit value of 1 in the free register indicates that the corresponding page in DRAM 706 is not currently allocated to any RDD. The FMMU 800 allocates a new page by scanning the free register for a page whose free bit is 1.

The FMMU 800 performs the following steps to execute AllocateRDDPage command:
1. Select the page table corresponding to this RDD based on ID argument.
2. Index the page table entry using the virtual page number argument as index.
3. Select a DRAM 706 page from the free register (in block 810), e.g., by scanning for next bit in the free register with value 1.
4. If no bit in the free register is 1, select a physical page with both Access and Dirty bits 0.
5. Else, select a page with Access bit 0, and send an exception message to the middleware 604 to swap the selected physical page to memory 106 (i.e., hard disk).
6. Write the selected DRAM 706 physical page base address in the selected page table entry.
7. Set the "Present" bit in the selected page entry to 1.
8. Write the physical page bit in the free register to 0.
9. Write the physical page bit in the "Access" register to 0.
10. Write the physical page bit in the "Dirty" register to 0.

DeAllocateRDD Command Execution

The FMMU 800 selects an entry in the RDD table using the ID argument as index and writes this entry valid bit to 0.

DeAllocateRDDPage Command Execution

The FMMU 800 selects the page table corresponding to the ID command argument and selects an entry in this page table based on the virtual page number argument. It reads the selected entry content to obtain the physical page number. It then clears the "Present" bit in the page table and uses the physical page number to set the "Free" bit to 1 and to clear the "Access" bit and "Dirty" bit to 0.

ReceiveRDD Command Execution

The FMMU 800 reads the RDD table entry indexed by the ID argument, and writes the RDD virtual based address from the RDD table into the RDD address counter register 812. The size argument is also written into the RDD size register 812 (see FIG. 8). This sets the FMMU 800 in a state ready to supply RDD addresses to a special Acceleration Functional Unit (AFU) 818 responsible for receiving the RDD data over the PCIe interface 708 from the server memory (i.e., DRAM) 106 and writing this data into the FPGA DRAM 706.

SendRDD Command Execution

This is similar to ReceiveRDD command except that the direction of the data transfer is from the FPGA DRAM 706 to the server memory (i.e., DRAM) 106.

ReceiveRDDPage Command Execution

The FMMU 800 reads the RDD table entry indexed by the ID argument, and then computes the page virtual base address from the RDD virtual base address and the virtual page number. It writes the computed page virtual based address to the RDD address counter register 812, and the default page size (e.g., 2 Megabytes) to the RDD size register 812 (see FIG. 8). This sets the FMMU 800 in a state ready to supply RDD page addresses to the special AFU 818 responsible for receiving the RDD page data over the PCIe interface 708 from the server memory (i.e., DRAM) 106 and writing this data into the FPGA DRAM 706.

SendRDDPage Command Execution

This is similar to ReceiveRDDPage command except that the direction of the data transfer is from the FPGA DRAM 706 to the server memory (i.e., DRAM) 106.

Stream Processing Support

The FMMU 800 supports stream processing by sequencing RDD addresses to a data cache 816, so that the data cache 816 will feed input RDD streams and receive output RDD streams to or from AFU 818. In addition to its main virtual memory management function, the FMMU 800 also acts as address generation sequencer that provides multiple streams of RDD addresses to a conventional data cache to feed accelerator functional units 818. FIG. 8 shows that RDD addresses from RDD counters are fed through a conventional translation look-aside buffer (TLB) 814 to data cache 816. The TLB 814 is a small cache of page table entries, making it a first level of a hierarchy page table entries (PTE) arrays. This helps reduce the average time it takes to perform the virtual to physical address lookup and mapping. In one example, the RDD page tables could be located off the FPGA chip 704 in on-board DRAM 706 and the TLB 814 may be located in on-chip static random access memory (SRAM). In another example, the RDD page tables could be on FPGA chip 704 in SRAM, and a very small micro-TLB could be implemented using FPGA 704 chip registers. FIG. 8 shows AFU 818 connected to the data cache 816 using two read ports and one write port. This allows AFU 818 to simultaneously read two data blocks from two input RDDs and simultaneously write the union of the input RDDs to another output RDD. To maximize the read and write bandwidth of the data cache 816, the RDD address counters 812 should be incremented by a value equal to the cache block size. The block size is 64 bytes in the implementation disclosed herein and matches the DRAM 706 to FPGA chip 704 data bus width.

FlatMap/combineByKey Accelerator Functional Unit

The following describes an alternative embodiment with an accelerator configuration of a flatMap operation pipelined with combineByKey operation. The input to Acceleration Functional Unit (AFU) 1200 of FIG. 12 is a stream of text file RDD partition from the server DRAM 106 transmitted over the PCIe interface 708. The AFU 1200 performs flatMap over the text stream to extract words, then transforms each extracted "word" into a pair object consisting of the "word" and the value "1". It then counts and combines the word pairs that have the same "word" into one word pair containing "word" and "count". This operation is equivalent to a local reduceByKey operation. The resulting RDD output of AFU 1200 is the same as the output of stage 1 in the word count code example discussed previously. Notice that even though the word count code illustration is one arbitrary example of using this accelerator card 702, the flatMap operation followed by combineByKey is an important acceleration function in the library, frequently used in Spark applications for processing large data files.

FIG. 12 shows a block diagram of an AFU 1200 in one possible configuration that includes the FMMU 800 as address generation unit, configured for supplying RDD addresses and caching the resulting wordPairs RDD partition, to be used at a later time, as a persistent RDD input to subsequent accelerated operations.

AFU 1200 comprises functional blocks (FUBs) and specific units configured to perform the merged flatMap/combineByKey operation. A first set of FUBs, shown as shaded blocks in FIG. 12, include the PCIe Interface Logic 1202, the FMMU 800, the TLB 1204 and the Data Cache 1206. The remaining unshaded blocks are a second set of FUBs that are specifically configured for optimizing the merged flatMap/combineByKey operation. These FUBs include: Command Register 1208, Command Microcode Control Unit 1210, Splitter 1212, Dictionary 1214, Write Virtual Address Register 1216, Read Virtual Address Register 1218, and Compare/Conditional Add data path FUB 1220.

The execution of the merged flatMap/combineByKey operation is initiated by the middleware 604 as follows:
1. Initialize the FMMU 800 by allocating a persistent wordPairs RDD using AllocateRDD, with size argument value of 0. The size argument should be set initially to 0 since this RDD is an output and its size cannot be determined until after the RDD wordPairs partition is computed.
2. Initialize a direct memory access (DMA) channel to stream the text file partition from the server DRAM 106 to the AFU 1200 over the PCIe interface 708 through PCIe Interface Logic 1202.
3. Send flatMap/combineByKey command to AFU command register 1208 over the PCIe bus 703. Two arguments in this command specify the PCIe text stream as the input RDD, and the wordPairs RDD allocated in step 1 as the output RDD. After this step, the AFU 1200 is ready for its task, and spins waiting for its input RDD to start streaming over the PCIe bus 703.
4. Start the DMA channel. This starts streaming the input RDD, thus activating the AFU execution sequence, which continues until end of stream. The AFU 1200 then signals the middleware 604 that it is done via an interrupt FlatMap/combineByKey Implementation and Execution Flow Describes next is the execution flow and the hardware details of the flatMap/combineByKey operation AFU 1200. To understand the functionality of this AFU hardware, it is necessary to understand first how the wordPairs RDD partition is stored in memory. The wordPairs are stored in memory as lists of (word, count) pairs, each with a valid bit. There is one list for each letter in the alphabet. For example, the list corresponding to letter "a" consists of all extracted words from the input stream that starts with the letter "a". Since words are extracted from the stream and inserted in the corresponding lists in no particular order, lists cannot be easily stored in memory in contiguous blocks. For example, a word starting with "t" could be followed by a word starting with any letter other than "t". Moreover, the final size of each list is not known apriori. Because of these conditions, wordPairs are stored, with valid bits, in non-contiguous 64-byte blocks in virtual memory. The size is equal to a cache block size, a choice made to maximize the read and processing bandwidth of the accelerator card 702.

Figures 13, 14:
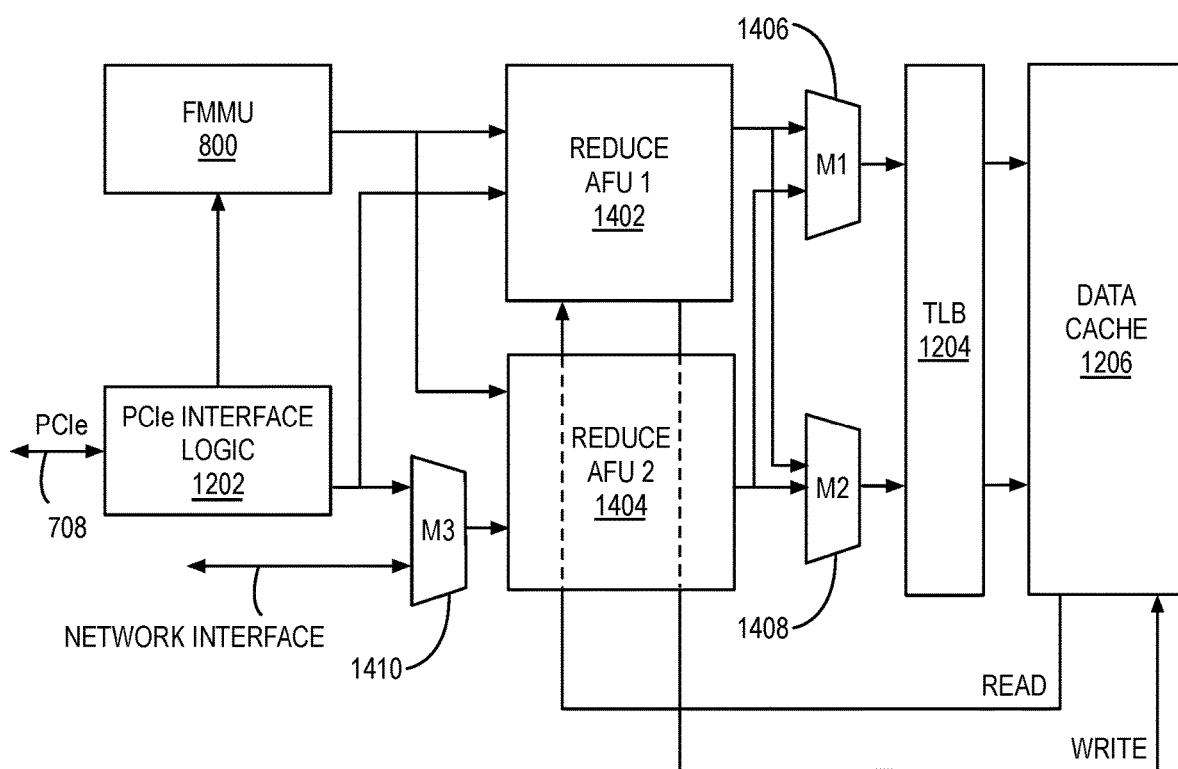
FIG. 13 shows a table with the general format of one wordPair RDD data cache block.
FIG. 14 shows a flatMap/combineByKey accelerator containing functional blocks (FUBs).

Since the blocks are not contiguous in memory, the blocks are logically organized in the form of link lists. Each block in the list of words that start with letter "a" contains in addition to (word, count) pairs and their valid bits, a virtual address that points to the next block containing "a" words in the list. A "dictionary" 1214, also allocated in virtual memory, contains the virtual address of the first block of each link list. Since there is one link list for each letter, the dictionary 1214 contains one virtual address for each letter in the alphabet. FIG. 13 shows a table with the general format of one wordPair RDD data cache block. The template field encoding defines the word and count size. Allowing multiple word and count size formats improves the utilization of the memory storage, since large count value words tend to be small in size and vice versa. For example, a configuration might be one format with 8 characters word size and 4 bytes count size, and another format with 16 characters word count and 2 bytes count size. The valid bits field contains 1 valid bit for the template, 1 valid bit for each word pair, and one additional bit for the next block virtual address. Finally, the next block virtual address field contains a pointer to the next virtual memory block in the link list.

Referring to FIG. 12 there is illustrated each specific FUB in the AFU 1200 with an accompanying description. The flatMap/combineByKey accelerator card 702 contains the following FUBs:
1. The Command Register 1208. The middleware 604 writes flatMap/combineByKey command into this register 1208 to initialize and trigger the AFU 1200 processing of the input data stream when it arrives over the PCIe bus 703.
2. The Microcode Control Unit 1210. This FUB decodes the command and executes a microcode sequence designed to provide the control signals to all the AFU 1200, necessary to process the input data stream.
3. The Splitter 1212. This FUB inserts bytes received from the PCIe 1202 into an input queue, process the bytes from the input queue and extracts words by removing white space and punctuation. It then converts each word to (word, 1) pair and writes the wordPairs into an output queue.
4. The Dictionary 1214. This is an array that contains an entry for each alphabet letter. Each entry contains a virtual address that points to the first of a list of 64-byte blocks in virtual memory, which contains a set of (word, count) pairs for words starting with the alphabet letter mapped to the entry.
5. Two Virtual Address Registers (Write Virtual Address Register 1216 and Read Virtual Address Register 1218). One of these two registers supplies the virtual address input to one read port of the TLB/Data Cache 1204/1206, and the other supplies the virtual address input to one write port of the TLB/Data Cache 1204/1206. The two registers 1216/1218 can be written from the RDD counter registers of the FMMU 800, from the virtual address pointer that is obtained from a wordPairs data cache RDD block, or from the virtual address of the dictionary entry mapped to the first letter of the processed word from the input stream.
6. Compare and Conditional Add Execution Unit 1220. This FUB 1220 receives one input of a 64-byte wordPair RDD block from the data cache 1206. Recall that each wordPair RDD block contains a number of (word, count) pairs with their valid bits and the virtual address of the next RDD block in the list. This FUB 1220 also receives as another an input one or more extracted (word, 1) pairs from the splitter FUB 1212 output queue. If the extracted word matches any word from the data cache block 1206, the count from the extracted (word, 1) pair (i.e., the value 1) is added to the count of the matching (word, count) pair from the data cache

1206. The matching pair in the data cache block 1206 is then updated with the new (word, count+1) pair using the write port.

Exemplary Cases of Execution Flows That Cover Operation of the flatMap/combineByKey AFU Case 1: Processing First Word of a List When an extracted word from the input stream is the first of a list, the list is Null at that time with no blocks in the list allocated to physical memory. This is the case since the FMMU 800 uses demand paging to allocate physical memory. However, virtual memory for the wordPairs RDD has been allocated by this time, since this is done by the middleware before starting the accelerator, as described above. Therefore, the FMMU virtual address counter has been initialized and is currently pointing to the next virtual address to be processed.

After the AFU 1200 reads a word pair from the output queue of the splitter 1212, it forwards it to the next execution pipeline stage, in which the dictionary 1214 is accessed. The first letter of the word is used to access the corresponding entry in the dictionary 1214. However, the virtual address in the entry will be invalid, since this the first word of the list. This is a dictionary miss event. On a dictionary miss event, the AFU 1200 control logic makes a request to the FMMU 800 to fetch the next virtual address of the wordPairs RDD from the FMMU RDD counter register 812. The fetched virtual address from the FMMU 800 is then loaded into the read virtual address register 1218, the write virtual address register 1216 and the dictionary 1214. The RDD counter register 812 is incremented by cache block size (i.e. 64) to point to the next virtual address block in the wordPairs RDD.

In the next execution pipe stage, the read virtual address is sent to the TLB 1204 and data cache 1206. The TLB 1204 and the data cache 1206 process this virtual address. Multiple scenarios could take place, such as TLB miss, page fault, or TLB hit. In case of TLB miss or page fault, the FMMU 800 handles these events as described above. In case of TLB hit, the physical address is read from the TLB 1204 and sent forward to the data cache 1206 to perform the data cache tag comparator step and determine if the data cache lookup has resulted in hit or miss. Since this is the processing of the first extracted word of the list, the cache lookup results in a miss. The physical address of the block is then sent to a Miss Status Holding Register to replace the cache block in the data cache. Note that there is no need to fetch the physical block from the DRAM, since this is an output RDD block and the AFU 1200 is performing the first write into this block (because of the dictionary miss). The physical location selected for replacement with this new wordPair RDD block is loaded with zeroes in all the block data entry fields shown in FIG. 13. The zeroed block is also sent to the compare/conditional add functional unit 1220.

When the compare/conditional add functional unit 1220 receives the zeroed block from the data cache 1206, it detects that the template format valid bit is 0. It subsequently writes the block into the data cache 1206 using the write port, filling the appropriate template value based on the size of the word input operand from the splitter 1212. It also fills the first word and count field in the data cache 1206 with the word and count input values from the splitter 1212. It also sets the template and first pair valid bits to 1, which completes the processing of the current word from the input stream.

Case 2: Processing a Word that is Already in a List

Since the word is in the list, the list is not null, and the dictionary entry has the valid virtual address of the first block in the link list. After this virtual address is read from the dictionary 1214, it is loaded in the read and write virtual address registers 1216/1218. Then, a read access to the TLB 1204 and data cache 1206 is started to read the first block of the link list and send it to the compare/conditional add functional unit 1220, potentially after handling any occurring TLB or data cache misses. Next, the functional unit compares the template needed to store the processed word with the template field from the cache block, as well as the processed word with the word field of each valid (word, count) pair from the data cache block 1206. If there is a template match and a word match, the count of the processed word is added to the count of the matching pair in the data cache 1206. The matching (word, count) pair is then updated with the new count value using the write port to the data cache 1206. If does not match, or none of the cache block words match, the next block virtual address from the data cache block 1206 is written into the read and write virtual address registers 1216/1218, and the TLB/data cache 1204/1206 lookup and compare/conditional add 1220 steps are repeated, until the word is found in the data cache 1206 and its count updated.

Case 3: Processing a Word that does not Match any Word in its List

This is a case in which the AFU 1200 is processing a word from the input stream and the lookup in the dictionary 1214 gives a valid virtual address. A valid virtual address indicates that a list mapped to the first letter of the input stream word currently processed exists and contains at least one word. In this case, blocks from the list will be repeatedly fetched from the data cache 1206 and searched, using the dictionary virtual address as pointer to the first block in the list, or the next block virtual address from the currently fetched data cache block 1206 as a pointer to the next block in the list. Since the word is not already in the list, the search will end unsuccessfully, in two possible ways: 1) either a template match on a cache block that is not completely full is reached and, in this case, the processed word and count will be inserted in the first (word, count) slot that has a valid bit of 0; or 2) the last block in the list is reached, a condition indicated by the currently fetched data cache block having a next block virtual address valid bit of 0. In this case, a new physical block will be allocated in the data cache using the virtual address from the FMMU wordPairs RDD counter register 812, and the processed word and count is inserted in the first (word, count) pair in the new allocated block. In addition, the next block virtual address field is updated to point to the new allocated block and the wordPairs RDD virtual address counter is incremented by 64, which is the size of one data cache block in the platform specification disclosed herein.

The wordPairs RDD are persisted in FPGA memory to use as input RDD in future accelerated operations and how to copy the wordPairs when needed to the server DRAM 106. This is accomplished by using a special AFU virtual memory space that is only accessible by specialized hardware accelerators and included in the acceleration library. In order to manage this special AFU virtual memory, one of the process ID encodings is reserved for this virtual address space and dedicated for use by the specific AFUs commands. Middleware cannot allocate this process ID to any of the executors 101*a*, and if it does, an execution error is returned to middleware by the FMMU 800. An AFU 1200 can now use this new virtual address space to retain any accelerator intermediate or "metadata" the hardware designer of any AFU wishes to persist with a persistent RDD.

Using the flatMap/combineByKey AFU as an example, some of the data that may be persisted may include:

1. Actual size of the wordPairs RDD partition after stripping out templates, valid bits, and next block virtual addresses. This is the size that is visible within the Spark environment outside the FPGA accelerator. This is also the size of the accelerated output RDD, and is therefore written at the end of accelerated operation execution into the size field in the RDD table of the FMMU 800.
2. Dictionary state at the end of the acceleration, which is needed for improved performance of future accelerated operations that use the wordPairs RDD as an input.
3. The number of (word, count) pairs that start with a particular letter in the alphabet, for each letter. This information could be used, for example, to improve at runtime load balance, and to and minimize data communication delay during shuffle operations across multiple physical nodes.
4. Any other data that the hardware configurer chooses to keep to help with performance optimization of later accelerated operations.

Notice that an AFU that uses special format of data storage for a particular RDD or additional metadata requires the hardware configurer to provide with the accelerator a special "copy" functional unit to re-format the RDD and/or strip any extraneous data. In the case of the flatMap/combineByKey AFU, the hardware configurer needs to provide special hardware for reformatting wordPairs RDD partition. This reformatting involves removing the extraneous format, valid bits, and next block virtual address, before copying the (word, count) pairs for to the server DRAM 106 over the PCIe interface 708, or to other FPGA accelerators of other cluster physical nodes over the cluster network.

Single-Chip Multi Accelerators FPGA Architecture

FIG. 14 shows a block diagram of dual-accelerator FPGA implementation of a flatMap/reduceByKey AFU. As described above, the shuffle operation is a serialization point during Spark execution that requires a significant delay. First, execution stages are bound by shuffle operations, meaning, a shuffle cannot start until all prior operations are completed, and no operations after the shuffle can start until the shuffle operation completes. Moreover, data shuffle in Spark involves splitting and writing data to the hard disk of each node followed by each node reading a subset of its input data for the next execution stage, from other worker nodes hard disks, over the cluster data communication network.

In reference to FIG. 14, the following capabilities of the FPGA hardware acceleration platform 1400 are taken advantage of:

1. Very high capacity in terms of programmable logic gates, connectivity and on-FPGA-chip static RAM storage.
2. Very high interconnect bandwidth and low latency of on-FPGA-chip interconnect compared to PCIe or cluster network interconnect.
3. Significantly higher amount of hardware level parallelism can be achieved with FPGA dataflow implementations compared to software implementations using multicore or general-purpose GPU threads.

The distributed FPGA accelerated platform disclosed herein exploits the advantages listed above to make significant improvements in architecture and performance beyond the Spark execution framework:

1. The platform removes Spark data shuffle serialization restriction, by combining data shuffle operation with map and reduce operations from before and after the data shuffle, in the same execution stage.
2. It accelerates the data shuffle operation using the FPGA hardware, without requiring the Spark software to be involved in partitioning the data and saving it on hard disk for other executors to pull.
3. In clusters that run multiple executors on the same multicore cluster node, the platform disclosed herein automatically mirrors the multiple executors on a node with multi-accelerator configuration on the node FPGA card. In other words, the platform 1400 transparently reconfigures the FPGA chip to assign a dedicated accelerator functional unit (1402, 1404 or other "n" AFUs) for each executor 101 process running on the multicore CPU. Therefore, the platform FPGA acceleration hardware matches the thread level parallelism provided by the multicore to achieve maximum acceleration throughput. Note that in future implementations, a configurer may consider multiple FPGA chips on the same acceleration card in order to avoid logic gates and storage capacity constraints of a single FPGA chip. In an alternative embodiment, a configurer may consider multiple FPGA acceleration cards each connected to the CPU using high performance point to point interface, thus avoiding bandwidth bottlenecks from multiple accelerators sharing the same PCIe interconnection to the multicore server CPU.
4. In addition to the hardware parallelism advantage, single chip multi-accelerator FPGA provides a great performance advantage when performing local reduceByKey operation. This is because (key, value) pairs RDD partitions that input the reduceByKey operation can be copied between the multiple accelerators over short, on chip interconnect, compared to transferring (key, value) pairs over PCIe, point to point, or network interconnect that span longer wires across multiple chips. In order to exploit this advantage, the platform disclosed herein performs reduceByKey operation in three steps: 1) it first performs a combineByKey operation within each accelerator, 2) it then performs local reduceByKey of RDD partitions distributed across single-chip accelerators, and 3) it finally performs reduceByKey operation of all the RDD partitions distributed across the cluster. Note that only step 3 involves remote data transfer between physical nodes across the network.
5. Finally, before executing step 3 of reduceByKey operation, the platform disclosed herein performs a distributed load-balancing process executed by a special FPGA functional block that is contained in the reduceByKey FPGA accelerator functional unit (AFU). The load-balancing process distributes data across the cluster nodes in a way that equalizes the total amount of data transfer over the network needed by each worker node to perform the global reduceByKey.

Dual Accelerator FPGA Implementation of FlatMap/ReduceByKey

The code example from above and single-chip dual-accelerator FPGA shall be used to illustrate how the platform 1400 disclosed herein accelerates the data shuffle, and the reduceByKey operation in the word count application. FIG. 14 shows a block diagram of the dual-accelerator FPGA implementation of the flatMap/reduceByKey AFU. The two AFUs, 1402 and 1404, in FIG. 14 share the FPGA Memory Management Unit (FMMU) 800, the TLB 1204 and the data cache units 1206 described above. They also share the PCIe bus 703 and interface logic 1202. Even though the implementation shares some hardware resources, a skilled FPGA hardware configurer can implement a higher performance configuration in which each of the two AFUs (1402 and 1404) has its own TLB 1204, data cache 1206 and PCIe resources. FIG. 14 shows 2 multiplexers (1406 and 1408) that are necessary for operating the two accelerators simultaneously. The multiplexers (1406 and 1408) allow the two accelerators (1402 and 1404) to share access to the two TLB/data cache read and write ports (1204/1206). We use a round robin priority scheme to control which virtual addresses from AFU 1402 and AFU 1404 are input into the TLB/data cache read and write ports (1204/1206). A third multiplexer, denoted as 1410, selects the input stream to AFU 1404 splitter to be either coming from the PCIe bus 706 or the network interface. The network interface input is used for performing reduceByKey of partitions distributed across multiple cluster nodes, which corresponds to step 3 of the reduceByKey execution steps listed earlier in this section.

AFU 1402 and AFU 1404 are basically the flatMap/combineByKey AFU described above, extended with additional commands that are implemented with microcode routines. Using microcode to implement additional operations avoids the need to reconfigure the FPGA chip, and the associated reconfiguration delay overhead. Three operations are added, which can be used together to perform the local and cluster level reduceByKey operations of the word pairs output from the flatMap/combineByKey stage. The three additional operations are:

1. ReadRDD (ID): When this command executes, the microcode issues a sequence of reads for the RDD associated with the ID passed through the command argument. The sequence of reads continues until the full RDD partition is fetched from the data cache 1206. The AFU determines when it has fully fetched the full RDD partition by comparing the size in bytes of the total word pairs fetched to the RDD size that was stored when the RDD was computed in the FMMU RDD table and with the RDD counter register 812. During this microcode sequence of reads, the splitter and compare/conditional add functional blocks are disabled.
2. ReduceByKey (ID1, ID2): This command performs a very similar execution sequence to the flatMap/combineByKey described above, except for the following modifications:
    a) Instead of processing an input stream from the PCIe interface, the input stream is grabbed from the data cache writeback bus. The cache writeback data bus has a tag field that identifies the RDD to which the data fetched from the cache belongs. When the writeback bus tag matches ID1 in argument 1 of the command, the AFU grabs the data block from the bus, extracts the (word, count) pairs and write them in the splitter output queue; and
    b) Instead of extracting words from a text input stream, the splitter extracts the valid (word, count) pairs from the input cache block based on the block format and writes them in its output queue. The compare/conditional add then reads the (word, count) pairs from the splitter output queue and combines them the (word, count) pairs in the RDD whose ID is equal to the ID2 value passed in the command's second argument.

The platform 1400 utilizes the above extensions to the flatMapCombineByKey AFU. The platform middleware looks for opportunities in the running application for combining multiple execution stages including data shuffle operations, and schedules them on the same multi-accelerator FPGA device. For example, the middleware assigns the execution of stage 1 and stage 2 of the word count example, shown in reference to FIG. 6 to the AFU shown in diagram 8, without copying any intermediate data between the FPGA card and the server node over the PCIe bus interface. The execution initiated by the middleware and performed by the AFU consists of the following steps:

1. Initialize the FMMU 800 by allocating two persistent wordPairs RDD partitions for AFU 1402 and AFU 1404 using AllocateRDD, with size argument value of 0. The size argument should be set initially to 0 since the size of the output cannot be determined until after the RDD wordPairs partition is computed.
2. Initialize two DMA channels to stream two text file partitions from the server DRAM buffers to AFU 1402 and AFU 1404 over the PCIe interface. The transfer of these two partitions over the PCIe is performed simultaneously using time multiplexing of the PCIe interface.
3. Send flatMap/combineByKey instructions to AFU 1402 and AFU 1404 command registers over the PCIe bus 706. Two arguments in each command specify the PCIe text stream as the input RDD, and the wordPairs RDD allocated in step 1 as the output RDD. After this step, the two AFUs (1402 and 1404) are ready for their task, and spin waiting for their input RDD streams to start arriving over the PCIe bus 706.
4. Start the two DMA channels. This starts streaming the input RDDs, thus activating AFU 1402 and AFU 1404 execution sequence, which continues simultaneously until each AFU reaches the end of its input stream, at which time, each AFU signals the middleware that it is done, via an interrupt.
5. Send ReduceByKey(AFU1-wordPairs-RDD-ID, AFU2-wordPairs-RDD-ID) to AFU 1404 command register.
6. Send ReadRDD(AFU1-wordPairs-RDD-ID) to AFU 1402 command register. This activates the input stream to AFU 1404, causing it to start executing its ReduceByKey command. When each AFU finishes executing its command, it signals the middleware that it is done, via an interrupt.

Cluster-Wide ReduceByKey Processing

In order to exploit the low latency single-chip data communication offered by platform multi-accelerator FPGA chips, the platform disclosed herein performs reduceByKey operation in three steps: 1) it first performs a combineByKey operation within each accelerator, 2) it then performs local reduceByKey of RDD partitions distributed across the single-chip accelerators, and 3) it finally performs reduceByKey operation of all the RDD partitions distributed across the cluster. Note that only step 3 involves cluster-wide remote data transfer between physical nodes across the network. In this section, we describe how the platform performs the cluster-wide (step 3) of reduceBykey operation.

Figures 15, 16:
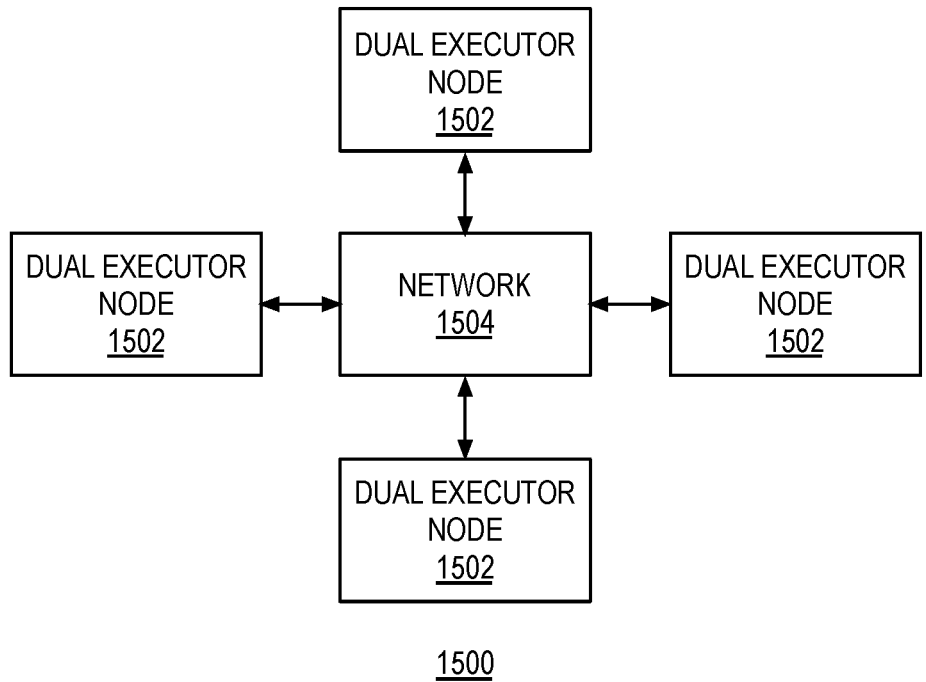
FIG. 15 illustrates a 4-node cluster example.
FIG. 16 shows a table with the number of (key, value) pairs in each node for each possible key, as well as the total in all nodes.

For illustration purposes, the 4-node cluster example 1500 shown in FIG. 15 is used. Each node 1502 in the network 1504 in the cluster is configured to run 2 executor processes, with two corresponding accelerators, in a single-chip FPGA organization similar to the one shown in FIG. 14.

In order to support the cluster-wide reduceByKey step, we further extend the functionality of the dual accelerator FPGA AFU implementation of reduceByKey shown in FIG. 14 with the following capabilities:

1. New functional block (FUB) that executes a distributed process for improving load balance.
2. New ReduceByKey (Node-ID, ID2) command: This command is very similar to command 2 discussed above (ReduceByKey (ID1, ID2)), except that the input RDD stream is specified to be coming from another node over the network interface, and not from AFU 1402. Argument 1 here, Node-ID, is an ID that uniquely identifies this node in the cluster. Any data arriving over the network interface with this Node-ID is grabbed and processed by AFU 1404 as an input stream of (key, value) pairs, i.e. wordPairs in the word count example application.
3. New CopyRDD(ID1, ID2) command: This command copies RDD ID1 from AFU 1404 and stores it in RDD ID2 in AFU 1402. Note that only metadata (i.e. dictionary, virtual address of RDD, RDD size, etc. . . . ) are copied, but not the physical data blocks in the cache/DRAM). Also, notice that ID2 argument value should be set to an RDD ID reserved for each AFU (1402 and 1404), one that cannot be used by middleware as described above.
4. New BalanceByKey(number-of-nodes) command: This command is issued by the middleware to each executor node after step 2 of the FlatMap/ReduceByKey is completed locally. All compute nodes in the cluster therefore execute this same command, and perform the exact same load-balancing process. At the end, the FlatMap/ReduceByKey AFU in each node 1502 knows what keys the load-balancing process has assigned to it to process, and what keys the load-balancing process has assigned to other nodes in the cluster. This is done without copying (key, value) pairs across nodes 1502, or storing (key, value) pairs to hard disk. Only metadata is exchanged between the nodes 1502 in this process. When this command is processed, microcode executes the following sequence of steps:
    a) Broadcast the number of (key,value) pairs per key the node 1502 has to every other node 1502 in the cluster over the network.
    b) Wait until the number of (key,value) pairs per key arrives from every other node in the cluster.
    c) Perform load-balancing process. For example, one load-balancing process could be one that re-partitions the overall cluster RDD by key, in such a way to make the number of (key,value) pairs that have to be shuffled to each node about the same for all nodes in the cluster.
    d) Broadcast a message to every other node when the load-balancing process is completed.
    e) Wait until messages are received from all other nodes indicating that the other nodes 1502 have completed their execution of the load-balancing process.
    f) Start transferring to every other node 1502, by key, the (key, value) pairs assigned by the load-balancing process to that other node 1502. Note that, in the process each node 1502 pushes data to other nodes 1502 in the cluster as needed by the data-shuffle operation. This is opposite to conventional Spark, in which each node pulls its assigned (key, value) pairs from the hard disk of the other nodes in the cluster.

Putting everything together and describing the full middleware sequence of commands that can be used to perform the complete, local (already described above) and then cluster-wide map-and-reduce sequence of the word count application. These are the following steps:

1. Initialize the FMMU 800 by allocating two persistent wordPairs RDD partitions for AFU 1402 and AFU 1404 using AllocateRDD, with size argument value of 0. The size argument should be set initially to 0 since the size of the output cannot be determined until after the RDD wordPairs partition is computed.
2. Initialize two DMA channels to stream two text file partitions from the server DRAM buffers to AFU 1402 and AFU 1404 over the PCIe interface 1202. The transfer of these two partitions over the PCIe is performed simultaneously using time multiplexing of the PCIe interface 1202.
3. Send flatMap/combineByKey instructions to AFU 1402 and AFU 1404 command registers over the PCIe bus 703. Two arguments in each command specify the PCIe text stream as the input RDD, and the wordPairs RDD allocated in step 1 as the output RDD. After this step, the two AFUs (1402 and 1404) are ready for their task, and spin waiting for their input RDD streams to start arriving over the PCIe bus 703.
4. Start the two DMA channels. This starts streaming the input RDDs, thus activating AFU 1402 and AFU 1404 execution sequence, which continues simultaneously until each AFU reaches the end of its input stream, at which time, each AFU signals the middleware that it is done, via an interrupt.
5. Send ReduceByKey(AFU 1402-wordPairs-RDD-ID, AFU 1404-wordPairs-RDD-ID) to AFU 1404 command register.
6. Send ReadRDD(AFU1-wordPairs-RDD-ID) to AFU 1402 command register. This activates the input stream to AFU 1404, causing it to start executing its ReduceByKey command. When each AFU finishes executing its command, it signals the middleware that it is done, via an interrupt.
7. Send CopyRDD(ID1, ID2) to AFU 1404 command register, to copy wordPairs RDD metadata from AFU 1404 to AFU 1402.
8. Send ReduceByKey (Node-ID, ID2) to AFU 1404 command register, where Node-ID is the ID of this node in the cluster, and ID2 is the ID of the output RDD (results RDD in word count code example). Note that this command will not start processing its input stream until it starts arriving to this node as a result of the execution of the BalanceByKey command in the following step.
9. Send BalanceByKey(number-of-nodes) to AFU 1402 command register. This will execute the load-balancing process and then push data to other nodes in the cluster as needed by the data-shuffle operation, for the cluster-wide reduce operations to start in the AFU 1404 of every node 1502.

Load Balancing Process

The following is an example of one possible load-balancing process. The table in FIG. 16 shows the number of (key, value) pairs in each node 1502 for each possible key, as well as the total in all nodes.

Step 1—As described earlier, each node 1502 broadcasts the number of (key, value) pairs it has in its RDD partition for each key to every other node 1502. Every node 1502, after receiving this metadata from every other node 1502 in the cluster, adds all the numbers together to generate the total shown in column 6 of FIG. 16. After this, every node has its own copy of the information shown in the table of FIG. 16.

Step 2—Each node sorts the table in FIG. 16 based on the "Total" in column 6, in decreasing order. After this step, each node 1502 will have its own copy of the table of FIG. 17.

Step 3—Each node assigns the largest 4 keys to the cluster nodes in round robin fashion. After this step, each node 1502 will have the following keys assigned to it: N1: A, N2: O, N3: H, N4: C Step 4—Each node 1502 repeats the following until all keys are assigned: a) for each node, add the "total" of the keys assigned to this node, b) assign the next key from the sorted table to the node with the smallest "total". At the end of this step, each node will have computed the same key assignment shown in the table of FIG. 18.

One of the ideas behind this process is that the total data size of each key is an approximation of the amount of (key, value) pairs that needs to be transferred over the network to the node 1502 that is assigned this key. The process tries to maintain a balance of the sum of the total size of the keys assigned to each node 1502, which approximately corresponds to the total data transfer to each node from other nodes during the shuffle. Since each accelerator in the global reduce step operates on the input data stream in a pipelined fashion, balancing the data transferred to each node 1502 will result in balanced execution time across the nodes during the cluster-wide reduce operation.

New API and data abstractions may be added on top of the RDD abstraction and API to Apache Spark starting with Spark version 1.6. For example, a Dataset, like an RDD, is a distributed collection of data. Datasets provide the benefits of RDDs (strong typing, ability to use powerful lambda functions) with the benefits of Spark SQL's optimized execution engine. A Dataset can be constructed from JVM objects and then manipulated using functional transformations (map, flatMap, filter, etc.). The Dataset API is available in Scala and Java. A DataFrame is a Dataset organized into named columns. It is conceptually equivalent to a table in a relational database or a data frame in R/Python, but with richer optimizations under the hood. DataFrames can be constructed from a wide array of sources such as: structured data files, tables in Hive, external databases, or existing RDDs. The DataFrame API is available in Scala, Java, Python, and R. In Scala and Java, a Dataset of Rows represents a DataFrame. In the Scala API, DataFrame is simply a type alias of Dataset[Row]. While, in Java API, users need to use Dataset<Row> to represent a DataFrame. Throughout the this disclosure, the RDD data abstraction has been for illustrative purposes. This should not be construed to limit the scope of the embodiments from being applied to other distributed data abstractions and APIs, such as Apache Spark DataFrames, Datasets or any other distributed data abstractions.

The foregoing embodiments are presently by way of example only; the scope of the present disclosure is to be limited only by the following claims.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known processes, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing embodiments of the invention. Various changes may be made in the function and arrangement of elements without departing from the spirit and scope of the invention.

Also, some embodiments were described as processes. Although these processes may describe the operations as a sequential process, many of the operations can be performed in parallel or concurrently. In addition, the order of the operations may be rearranged. A process may have additional steps not included in the figures. Also, a number of steps may be undertaken before, during, or after the above elements are considered.

Having described several embodiments, various modifications, alternative constructions, and equivalents may be used without departing from the spirit of the disclosure. For example, the above elements may merely be a component of a larger system, wherein other rules may take precedence over or otherwise modify the application of the invention. Accordingly, the above description does not limit the scope of the disclosure.

The foregoing has outlined rather broadly features and technical advantages of examples in order that the detailed description that follows can be better understood. Additional features and advantages will be described hereinafter. The conception and specific examples disclosed can be readily utilized as a basis for modifying or designing other structures for carrying out the same purposes of the present disclosure. Such equivalent constructions do not depart from the spirit and scope of the appended claims. Features which are believed to be feature of the concepts disclosed herein, both as to their organization and method of operation, together with associated advantages, will be better understood from the following description when considered in connection with the accompanying figures. Each of the figures is provided for the purpose of illustration only and not as a definition of the limits of the claims.

The foregoing has outlined rather broadly features and technical advantages of examples in order that the detailed description that follows can be better understood. The foregoing embodiments are presently by way of example only; the scope of the present disclosure is to be limited only by the claims. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples. Additional features and advantages will be described hereinafter. The conception and specific examples disclosed can be readily utilized as a basis for modifying or designing other structures for carrying out the same purposes of the present disclosure. Such equivalent constructions do not depart from the spirit and scope of the appended claims. Each of the figures is provided for the purpose of illustration and description only and not as a definition of the limits of the claims. No language in the specification should be construed as indicating any non-claimed element as essential to the practice of the invention Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Specific details are given in the description to provide a thorough understanding of the embodiments. However, embodiments may be practiced without these specific details. For example, well-known processes, structures, and techniques have been shown without unnecessary detail in order to avoid obscuring the embodiments. This description provides example embodiments only, and is not intended to limit the scope, applicability, or configuration of the disclosure. Rather, the preceding description of the embodiments will provide those skilled in the art with an enabling description for implementing embodiments of the disclosure. Various changes may be made in the function and arrangement of elements without departing from the spirit and scope of the disclosure.

Although process (or method) steps may be described or claimed in a particular sequential order, such processes may be configured to work in different orders. In other words, any sequence or order of steps that may be explicitly described or claimed does not necessarily indicate a requirement that the steps be performed in that order unless specifically indicated. Moreover, the illustration of a process by its depiction in a drawing does not imply that the illustrated process is exclusive of other variations and modifications thereto, does not necessarily imply that the illustrated process or any of its steps are necessary to the embodiment(s), and does not imply that the illustrated process is preferred.

To aid the Patent Office and any readers of any patent issued on this application in interpreting the claims appended hereto, applicants wish to note that they do not intend any of the appended claims or claim elements to invoke 35 U.S.C. 112(f) unless the words "means for" or "step for" are explicitly used in the particular claim.

The definitions of the words or elements of the claims shall include not only the combination of elements which are literally set forth, but all equivalent structure, material or acts for performing substantially the same function in substantially the same way to obtain substantially the same result.

Neither the Title (set forth at the beginning of the first page of the present application) nor the Abstract (set forth at the end of the present application) is to be taken as limiting in any way as the scope of the disclosed invention(s). The title of the present application and headings of sections provided in the present application are for convenience only, and are not to be taken as limiting the disclosure in any way.

Devices that are described as in "communication" with each other or "coupled" to each other need not be in continuous communication with each other or in direct physical contact, unless expressly specified otherwise. On the contrary, such devices need only transmit to each other as necessary or desirable, and may actually refrain from exchanging data most of the time. For example, a machine in communication with or coupled with another machine via the Internet may not transmit data to the other machine for long period of time (e.g. weeks at a time). In addition, devices that are in communication with or coupled with each other may communicate directly or indirectly through one or more intermediaries.

It should be noted that the recitation of ranges of values in this disclosure are merely intended to serve as a shorthand method of referring individually to each separate value falling within the range, unless otherwise indicated herein, and each separate value is incorporated into the specification as if it were individually recited herein. Therefore, any given numerical range shall include whole and fractions of numbers within the range. For example, the range "1 to 10" shall be interpreted to specifically include whole numbers between 1 and 10 (e.g., 1, 2, 3, . . . 9) and non-whole numbers (e.g., 1.1, 1.2, . . . 1.9).

What is claimed is:

1. A demand paging system for distributed big data caching comprising:
    a server node having a server processor, a server memory and an accelerator; the accelerator having an integrated circuit with a memory management unit,
an interface, a first memory, a second memory and a third memory;
    the memory management unit is capable of allocating virtual memory for data set partitions for input or for output of data pages generated during acceleration, wherein the first memory is capable of storing virtual addresses of the data set partitions;
    the memory management unit is capable of allocating the data pages in the third memory corresponding to virtual pages of data sets with virtual addresses stored in the first memory;
    the second memory is configured for storing information about the data pages accessed by the accelerator;
    the server memory and the third memory are capable of storing and persisting input and output of the data set partitions across application execution stages;

the interface is located between acceleration software contained in the server memory which is capable of being executed by the server processor, wherein the interface is capable of copying input and output streams of the data pages between the accelerator and the server memory;

the integrated circuit capable of signaling data page faults to the acceleration software whenever the data pages need to be read from the server memory, and wherein the acceleration software is further capable of dispatching commands to allocate and deallocate distributed data sets and data pages in the accelerator.

2. The system of claim 1 wherein the processor is further capable of generating commands from the acceleration software to allocate the data set partitions for non-persistent data set partitions generated during acceleration for application defined data.

3. The system of claim 1, wherein the integrated circuit is at least one of the group consisting of: a field programmable gate array (FPGA) chip and an application specific integrated circuit (ASIC).

4. The system of claim 1, wherein the accelerator and the server processor are on the same integrated circuit.

5. The system of claim 1 wherein the acceleration software further comprises:

a runtime scheduler that is capable of tracking explicit and implicit distributed data sets that reside in the first memory.

6. The system of claim 1 wherein the acceleration software is further capable of copying distributed data sets between the server memory and the accelerator.

7. The system of claim 1 wherein the acceleration software is capable of passing a zero in a size argument when the data set size is unknown.

8. The system of claim 1 wherein the data set entries include a valid bit, data set virtual base address and data set size.

9. The system of claim 1 wherein the memory management unit further comprises:

a set of page tables that includes one page table for each data set entry in the data set table and wherein each page table contains a plurality of page table entries.

10. The system of claim 1 wherein the memory management unit further comprises:

an access register which monitors pages which have not been accessed recently and provides this page for allocation to a new page;

a dirty register which monitors pages which have been written since allocation in the third memory and upon which the memory management unit sends a message to the acceleration software requesting that the page be saved to the server memory; and a free register which monitors pages in the third memory which are not currently allocated to any of the data sets.

11. The system of claim 1 wherein the memory management unit is capable of address generation sequencing to provide a plurality of streams of data sets to a cache to feed an accelerator functional unit.

12. A demand paging method for distributed big data caching in a server having a server processor and a server memory, the method comprising:

allocating virtual memory in the server by an accelerator having an integrated circuit with a memory management unit, an interface, a first memory, a second memory and a third memory, wherein the memory management unit is capable of allocating the virtual memory for data set partitions for input data or output of data pages generated during acceleration;

storing virtual addresses of the data set partitions in the first memory;

allocating by the memory management unit the data pages in the third memory corresponding to virtual pages of data sets with virtual addresses stored in the first memory;

storing information about the data pages accessed by the accelerator in the second memory;

storing and persisting input and output of the data set partitions across application execution stages in the server memory and the third memory;

copying input and output streams of the data pages at an interface between the accelerator and the server memory;

signaling data page faults to the accelerator whenever the data pages need to be read from the server memory, and dispatching commands to allocated and deallocated distributed data sets and data pages in the accelerator.

13. The method of claim 12 further comprising:

generating commands from the acceleration software to allocate the data set partitions for non-persistent data set partitions generated during acceleration for application defined data.

14. The method of claim 12 wherein the integrated circuit is one of the group consisting of: a field programmable gate array (FPGA) chip and an application specific integrated circuit (ASIC).

15. The method of claim 12, wherein the accelerator and the server processor are on the same integrated circuit.

16. The method of claim 12 wherein the server memory executes acceleration software on the server processor to track explicit and implicit distributed data sets that reside in the first memory on a runtime scheduler.

17. The method of claim 12 further comprising:

copying distributed data sets between the server memory and the accelerator.

18. The method of claim 12 further comprising:

passing a zero in a size argument when the data set size is unknown.

19. The method of claim 12 wherein the data set entries include a valid bit, data set virtual base address and data set size.

20. The method of claim 12 wherein the memory management unit further comprises:

a set of page tables that includes one page table for each data set entry in the data set table and wherein each page table contains a plurality of page table entries.

21. The method of claim 12 further comprising:

monitoring pages in an access register in the memory management unit which have not been accessed recently and provides this page for allocation to a new page;

monitoring pages in a dirty register in the memory management unit which have been written since allocation in the first memory and upon which the memory management unit sends a message to the acceleration software requesting that the page be saved to the server memory; and monitoring pages in a free register which are not currently allocated to any of the data sets.

22. The method of claim 12 further comprising:

providing a plurality of streams of the data sets to a cache to feed an accelerator functional unit through address generation sequencing in the memory management unit.

* * * * *